(12) United States Patent
Togashi et al.

(10) Patent No.: US 8,012,608 B2
(45) Date of Patent: Sep. 6, 2011

(54) POLYMER CONTAINING SULFO GROUP AND ORGANIC ELECTROLUMINESCENT ELEMENT CONTAINING THE POLYMER

(75) Inventors: Kazuhiko Togashi, Ichihara (JP); Junko Naruse, Ichihara (JP); Naruyoshi Mita, Sodegaura (JP)

(73) Assignee: Yamamoto Chemcials, Inc., Yao-Shi, Osaka (JP)

( * ) Notice: Subject to any disclaimer, the term of this patent is extended or adjusted under 35 U.S.C. 154(b) by 563 days.

(21) Appl. No.: 12/090,032

(22) PCT Filed: Oct. 12, 2006

(86) PCT No.: PCT/JP2006/320376
§ 371 (c)(1),
(2), (4) Date: Apr. 11, 2008

(87) PCT Pub. No.: WO2007/043607
PCT Pub. Date: Apr. 19, 2007

(65) Prior Publication Data
US 2009/0230851 A1    Sep. 17, 2009

(30) Foreign Application Priority Data

Oct. 13, 2005  (JP) ................. 2005-298775

(51) Int. Cl.
*H01L 51/54*  (2006.01)
(52) U.S. Cl. ......... 428/690; 428/917; 313/504; 528/380
(58) Field of Classification Search .................. 428/690, 428/917; 313/504; 528/380
See application file for complete search history.

(56) References Cited

U.S. PATENT DOCUMENTS

| 5,879,821 A | 3/1999 | Hsieh |
| 6,034,206 A | 3/2000 | Yamamoto |
| 2004/0109955 A1* | 6/2004 | Kitano et al. ................. 428/1.1 |

(Continued)

FOREIGN PATENT DOCUMENTS

EP    1 394 188 A1    3/2004

(Continued)

OTHER PUBLICATIONS

Imai et. al. Novel Synthesis . . . Polycondensation . . . Aromatic Diamines, 1988, Macromolecules, vol. 21, pp. 1908-1911.*

(Continued)

*Primary Examiner* — D. Lawrnece Tarazano
*Assistant Examiner* — Gregory Clark
(74) *Attorney, Agent, or Firm* — Buchanan Ingersoll & Rooney PC

(57) ABSTRACT

A polymer compound suitable for use in organic electroluminescent elements; a process for producing the compound; and an organic electroluminescent element employing the compound. The polymer is a sulfo-containing polymer characterized by having a structure formed by introducing sulfo groups into a polymer comprising repeating units represented by the general formula (1):

[Chemical Formula 1]

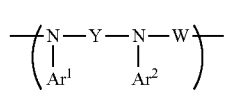

(1)

wherein, in the formula, $Ar^1$ and $Ar^2$ each represents a monovalent aromatic group; Y represents a divalent group comprising an aromatic group; and W represents a divalent aromatic group having 4 to 30 carbon atoms.

28 Claims, 4 Drawing Sheets

U.S. PATENT DOCUMENTS

| | | |
|---|---|---|
| 2004/0262574 A1 | 12/2004 | Suzuki et al. |
| 2005/0238917 A1 | 10/2005 | Yasuda et al. |

FOREIGN PATENT DOCUMENTS

| | | | |
|---|---|---|---|
| JP | 11-246660 A | | 9/1999 |
| JP | 2000-091081 A | | 3/2000 |
| JP | 2003-212866 | * | 7/2003 |
| JP | 2004-067970 A | | 3/2004 |
| JP | 2005-251734 A | | 9/2005 |
| JP | 2005-306998 A | | 11/2005 |
| WO | WO 99/54385 A1 | | 10/1999 |

OTHER PUBLICATIONS

Extended European Search Report dated May 28, 2010 issued in corresponding European Patent Application No. 06 81 1673.

* cited by examiner

POLYMER CONTAINING SULFO GROUP AND ORGANIC ELECTROLUMINESCENT ELEMENT CONTAINING THE POLYMER

TECHNICAL FIELD

The present invention relates to a novel polymer compound containing sulfo groups and a process for producing the same. Further, the invention relates to an organic electroluminescent element containing the compound.

BACKGROUND ART

In recent years, research and development of functional materials using organic compounds have been actively attempted. In late years, development of organic electroluminescent elements (organic EL elements) using organic compounds has been vigorously advanced as constituent materials of elements.

The organic electroluminescent element is an element having a structure that a thin film containing a fluorescent organic compound is held between an anode and a cathode, in which electrons and holes are injected in the thin film for recombination to generate excitons and luminescence occurs using light released in deactivating the excitons. The organic electroluminescent element enables luminescence at a low direct current voltage of about several volts to several tens of volts. Further, luminescence of various colors (for example, red, blue and green) is possible by selecting the types of fluorescent organic compounds. The organic electroluminescent element having such characteristics is expected to be applied to various luminescent elements, display devices and the like.

Recently, due to the characteristics for enabling patterning by a printing method, as a material useful for a large screen TV panel or a flexible sheet display, development of organic electroluminescent elements using conjugated luminescent polymers (polymer organic electroluminescent elements: polymer organic EL elements) as a fluorescent organic compound has been vigorously advanced.

In the organic electroluminescent element, a hole transport layer or an electron transport layer has been used such that a luminescent layer has been held singly between electrodes or stacked thereto. However, in order to enhance characteristics or life of an element, there has been generally used a hole injection layer in the vicinity of an anode. As a material of a hole injection layer in the polymer organic electroluminescent element (hole injection material), there have been known a material of a dispersion (Bayer Co., Ltd., product name: BaytronP) containing a polythiophene derivative (poly(3,4-ethylene dioxythiophene): hereinafter referred to as PEDOT) that is an electroconductive polymer and poly(styrene sulfonic acid) (hereinafter referred to as PSS) that is a polymer protonic acid, and the like (Patent Document 1).

Patent Document 1: Japanese Patent Laid-open No. 2000-91081

DISCLOSURE OF THE INVENTION

The aforementioned electroconductive polymer material is lacking in the solubility toward organic solvents, and is in a dispersion state with water unsuitable for use in the electronic industry as a solvent. In particular, in the organic electroluminescent element, there has been known that water causes a problem of a short circuit of an element or the like. However, since the aforementioned electroconductive polymer material uses water as a solvent, there has been pointed out that it is difficult to handle the element at the time of production thereof. Furthermore, since a high molecular weight PSS has been excessively used relative to PEDOT of the electroconductive polymer, there has been pointed out a problem that the formation of a homogeneous thin film is difficult due to the cohesiveness. Furthermore, the organic electroluminescent element having a hole injection layer using PEDOT generally has a short life and is not practically satisfied.

An object of the present invention is to provide a novel polymer compound suitable for use in organic electroluminescent elements, a process for producing the compound and an organic electroluminescent element containing the compound.

In order to achieve the above objects, the present inventors have conducted an extensive study and as a result, have found that a novel polymer compound containing a sulfo group is soluble in an organic solvent, is not cohesive, and capable of forming a homogeneous thin film, and by using the compound, an organic electroluminescent element with a long life can be obtained. Thus, the present invention has been completed.

That is, according to the present invention, there is provided (1) a sulfo group-containing polymer compound having a structure formed by introducing sulfo groups into a polymer compound composed of repeating units represented by the general formula (1),

[Chemical Formula 1]

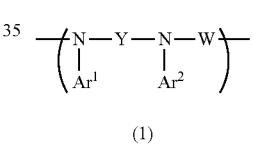

(1)

wherein, in the formula, $Ar^1$ and $Ar^2$ each represents a monovalent aromatic group; Y represents a divalent group containing an aromatic group; and W represents a divalent aromatic group having 4 to 30 carbon atoms.

Meanwhile, the following compounds are preferred embodiments of the sulfo group-containing polymer compound of the present invention:

(2) the sulfo group-containing polymer compound as set forth in (1), wherein, in the general formula (1), a group represented by Y is a group represented by the general formula (a), and a group represented by W is any of groups selected from the general formulae (b-1) to (b-8),

Y:

[Chemical Formula 2]

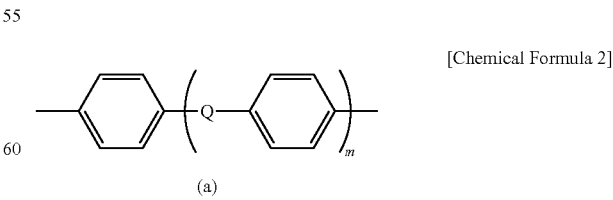

(a)

wherein, in the formula, -Q- is a group selected from the group consisting of a single bond, —O—, —S—, —CH$_2$—, —CMe$_2$-, —CO—, —SO—, —SO$_2$—, —SiH$_2$— and —SiMe$_2$-; and m represents an integer of 0 to 2,

W:

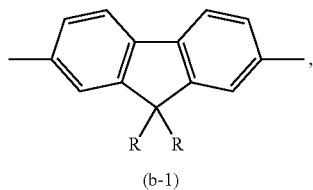
(b-1)

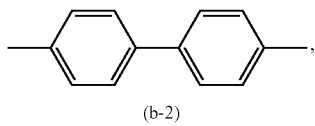
(b-2)

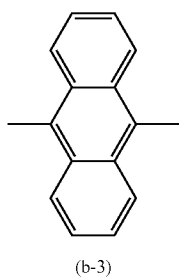
(b-3)

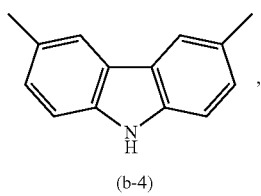
(b-4)

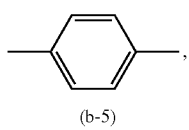
(b-5)

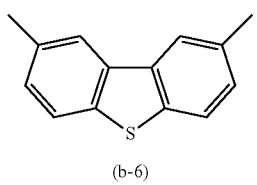
(b-6)

[Chemical Formula 3]

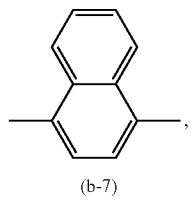
(b-7)

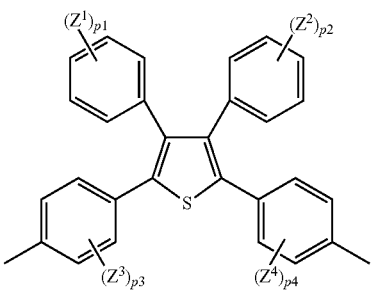
(b-8)

wherein, in the formula (b-1), R represents a hydrogen atom, a halogen atom, an alkyl group, an alkyloxy group or an aromatic group, in the formula (b-8), $Z^1$ to $Z^4$ each represents a substituent; p1 and p2 each represents an integer of 0 to 5; p3 and p4 each represents an integer of 0 to 4;

(3) the sulfo group-containing polymer compound as set forth in (1), having at least one of repeating units in which $Ar^1$, $Ar^2$, Y and at least one of four benzene rings bonded to a thiophene ring are substituted with a sulfo group in a polymer chain, in the repeating unit represented by the general formula (2),

[Chemical Formula 4]

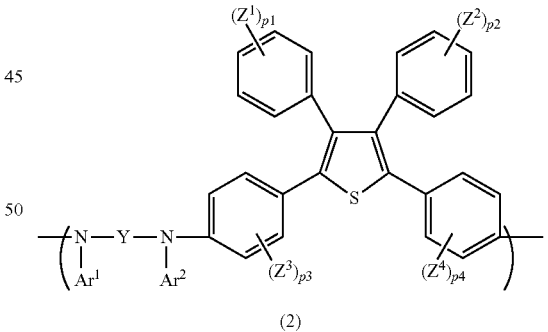
(2)

wherein, in the formula, $Ar^1$, $Ar^2$ and Y are the same as the general formula (1); $Z^1$ to $Z^4$ each represents a substituent; p1 and p2 each represents an integer of 0 to 5; p3 and p4 each represents an integer of 0 to 4;

(4) the sulfo group-containing polymer compound as set forth in (3), having at least one of repeating units in which at least one of benzene rings is substituted with a sulfo group in a polymer chain, in the repeating unit represented by the general formula (3),

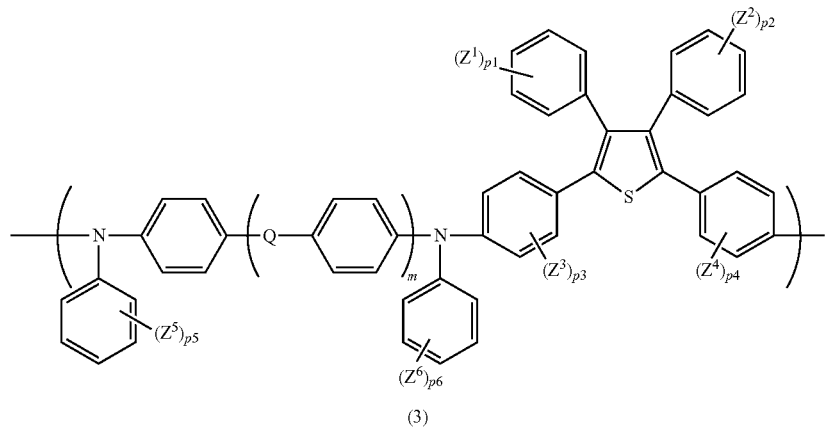

(3)

wherein, in the formula, $Z^1$ to $Z^4$ and p1 to p4 are the same as described above; $Z^5$ and $Z^6$ each represents a substituent; p5 and p6 each represents an integer of 0 to 5; m represents an integer of 0 to 2; and -Q- represents a group represented by a single bond, —O—, —S—, —CH$_2$—, —CMe$_2$-, —CO—, —SO—, —SO$_2$—, —SiH$_2$— or —SiMe$_2$-;

(5) the sulfo group-containing polymer compound as set forth in (3), having at least one of repeating units in which at least one of benzene rings and naphthalene rings is substituted with a sulfo group in a polymer chain, in the repeating unit represented by the general formula (3a), wherein, in the formula, D represents an unsubstituted or substituted linear, branched or cyclic alkyl group having 1 to 8 carbon atoms, an unsubstituted or substituted monovalent aromatic group having 4 to 12 carbon atoms, or an unsubstituted or substituted aralkyl group having 5 to 20 carbon atoms; and L represents 0 or 1.

Furthermore, the present invention includes the following:

(7) an organic electroluminescent material made of the sulfo group-containing polymer compound as set forth in any one of (1), (3), (4) and (5);

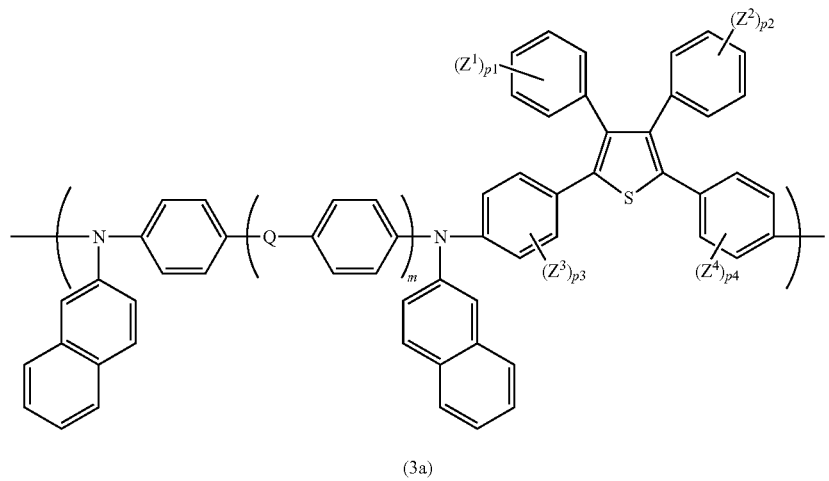

(3a)

wherein, in the formula, $Z^1$ to $Z^4$ and p1 to p4 are the same as described above; m represents an integer of 0 to 2; and -Q- represents a group represented by a single bond, —O—, —S—, —CH$_2$—, —CMe$_2$-, —CO—, —SO—, —SO$_2$—, —SiH$_2$— or —SiMe$_2$-; and (6) the sulfo group-containing polymer compound as set forth in any one of (2) to (5), wherein the $Z^1$ to $Z^4$ may be the same or different and are each a group selected from the group consisting of a carboxyl group, an alkoxycarbonyl group, a carbonyloxy group, a hydroxyl group, an amino group, a mono-substituted amino group, a di-substituted amino group and a group represented by the general formula (1a), —(O)$_L$-D  (1a)

(8) an organic electroluminescent element obtained by interposing at least one of layers containing at least one kind of the sulfo group-containing polymer compounds as set forth in any one of (1), (3), (4) and (5) between a pair of electrodes;

(9) the organic electroluminescent element as set forth in (8), wherein the layer containing the sulfo group-containing polymer compound as set forth in any one of (1), (3), (4) and (5) is an electric charge injection transport layer;

(10) the organic electroluminescent element as set forth in (9), wherein the electric charge injection transport layer is a hole injection transport layer;

(11) the organic electroluminescent element as set forth in (8), wherein the layer containing the sulfo group-containing polymer compound as set forth in any one of (1), (3), (4) and (5) is a luminescent layer;

(12) the organic electroluminescent element as set forth in any one of (8) to (11), wherein a luminescent layer is further provided between a pair of electrodes;

(13) the organic electroluminescent element as set forth in any one of (8) to (12), wherein an electron injection transport layer is further provided between a pair of electrodes; and

(14) a process for producing a sulfo group-containing polymer compound including sulfonating a polymer compound having repeating units represented by the general formula (2),

[Chemical Formula 7]

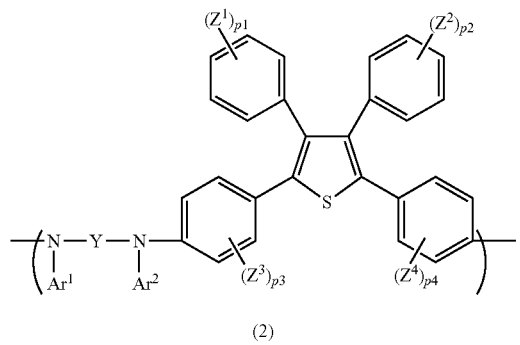

(2)

wherein, in the formula, $Ar^1$, $Ar^2$ and Y are the same as described above; $Z^1$ to $Z^4$ each represents a substituent; p1 and p2 each represents an integer of 0 to 5; p3 and p4 each represents an integer of 0 to 4.

According to the present invention, it is possible to provide a polymer compound which is soluble in an organic solvent, is not cohesive, capable of forming a homogeneous thin film and suitable for use in organic electroluminescent elements, and an organic electroluminescent element with a long life.

BEST MODE FOR CARRYING OUT THE INVENTION

Figure 1:
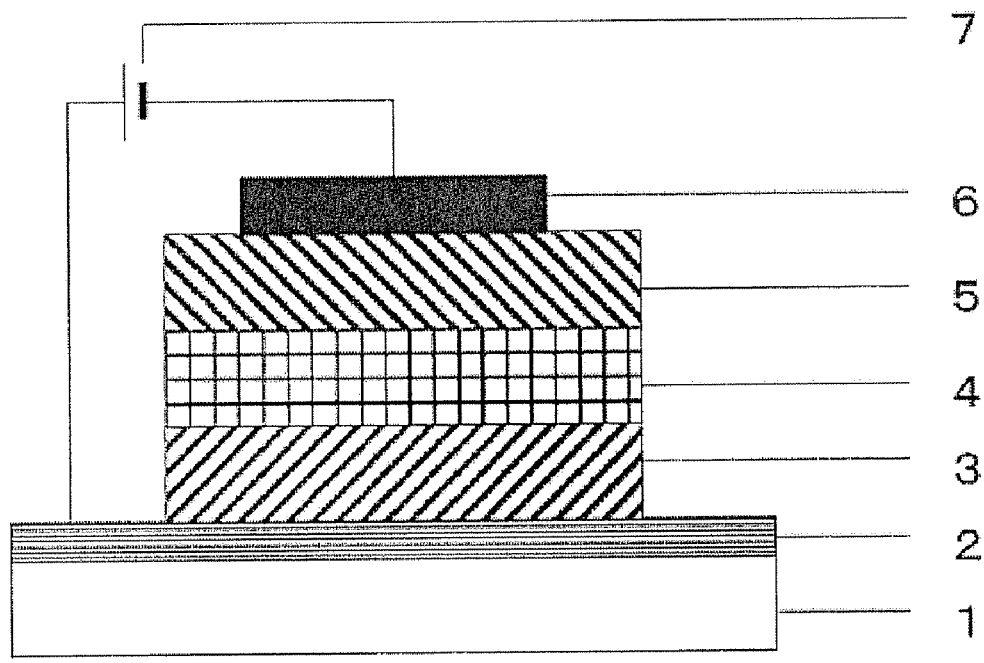
FIG. 1 is a schematic sectional view of one example of the organic electroluminescent element.

The present invention will be illustrated in detail below.

The sulfo group-containing polymer compound of the present invention has a structure formed by introducing sulfo groups into a polymer compound composed of repeating units represented by the general formula (1), General Formula (1):

[Chemical Formula 8]

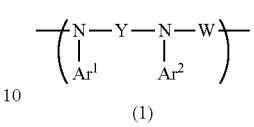

(1)

wherein, in the formula, $Ar^1$ and $Ar^2$ each represents a monovalent aromatic group; Y represents a divalent group containing an aromatic group; and W represents a divalent aromatic group having 4 to 30 carbon atoms.

Furthermore, in the general formula (1), it is preferable that a group represented by Y is a group represented by the general formula (a), and a group represented by W is any of groups selected from the general formulae (b-1) to (b-8),

Y:

[Chemical Formula 9]

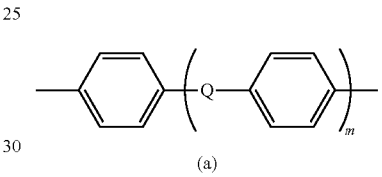

(a)

wherein, in the formula, -Q- is a group selected from the group consisting of a single bond, —O—, —S—, —CH$_2$—, —CMe$_2$-, —CO—, —SO—, —SO$_2$—, —SiH$_2$— and —SiMe$_2$-; and m represents an integer of 0 to 2,

W:

[Chemical Formula 10]

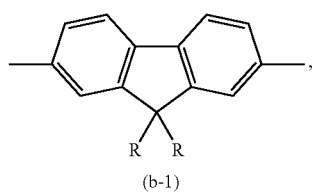

(b-1)

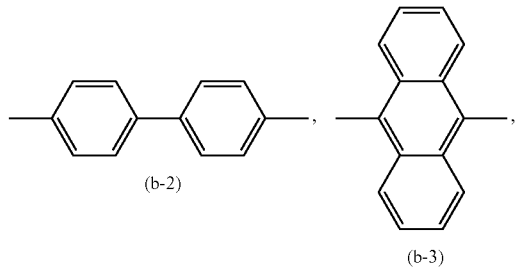

(b-2), (b-3)

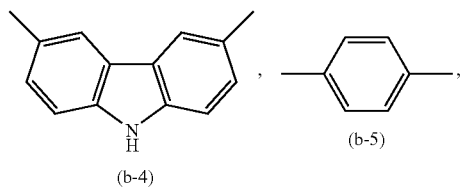

(b-4), (b-5)

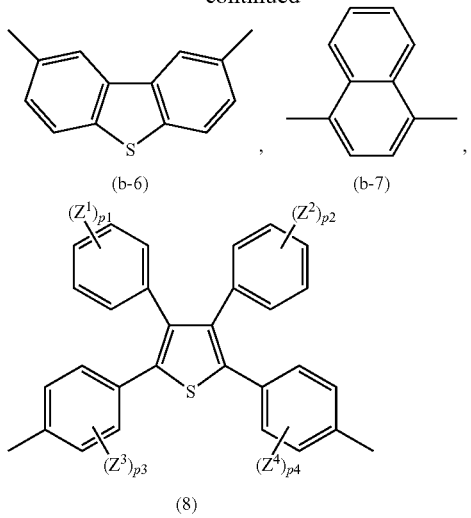

wherein, in the formula (b-1), R represents a hydrogen atom, a halogen atom, an alkyl group, an alkyloxy group or an aromatic group, in the formula (b-8), $Z^1$ to $Z^4$ each represents a substituent; p1 and p2 each represent an integer of 0 to 5; p3 and p4 each represents an integer of 0 to 4.

The number of sulfo groups is not particularly limited. However, the average number of sulfo groups per a repeating unit is from 0.1 to 20, preferably from 0.5 to 10 and more preferably from 1 to 5.

In the general formula (1), $Ar^1$ and $Ar^2$ independently represent a monovalent aromatic group, and include a monovalent aromatic hydrocarbon group or a monovalent aromatic heterocyclic group. These groups may be unsubstituted or substituted. In case the group is an unsubstituted or substituted aromatic hydrocarbon group, the number of carbon atoms constituting a ring of the group is preferably from 6 to 30 and more preferably from 6 to 20. On the other hand, when the group is an unsubstituted or substituted aromatic heterocyclic group, the number of carbon atoms constituting a ring of the group is preferably from 3 to 30 and more preferably from 3 to 20. $Ar^1$ and $Ar^2$ are preferably the same groups and further preferably the same aromatic hydrocarbon groups.

Concrete examples of the aromatic hydrocarbon group or aromatic heterocyclic group of $Ar^1$ and $Ar^2$ include a phenyl group, a 1-naphthyl group, a 2-naphthyl group, a 2-anthracenyl group, a 9-anthracenyl group, a 1-phenanthryl group, a 2-phenanthryl group, 3-phenanthryl group, a 4-phenanthryl group, a 9-phenanthryl group, a 2-fluoro-9-phenanthryl group, a 4-quinolinyl group, a 1-pyrenyl group, a 2-pyrenyl group, a 4-pyridinyl group, a 3-pyridinyl group, a 2-pyridinyl group, a 4-pyrimidinyl group, a 3-pyrimidinyl group, a 2-pyrimidinyl group, a 3-furanyl group, a 2-furanyl group, a 3-thienyl group, a 2-thienyl group, a 2-oxazolyl group, a 2-thiazolyl group, a 2-benzoxazolyl group, a 2-benzothiazolyl group, a 2-benzoimidazolyl group and the like.

Examples of the substituent on the aromatic hydrocarbon group or aromatic heterocyclic group of $Ar^1$ and $Ar^2$ include a carboxyl group, an alkoxycarbonyl group, a carbonyloxy group, a hydroxyl group, an amino group, a mono-substituted amino group, a di-substituted amino group and a group represented by the general formula (1a), —(O)$_L$-D    (1a)

wherein, in the formula, D represents an unsubstituted or substituted linear, branched or cyclic alkyl group having 1 to 8 carbon atoms, an unsubstituted or substituted monovalent aromatic group having 4 to 12 carbon atoms or an unsubstituted or substituted aralkyl group having 5 to 20 carbon atoms; and L represents 0 or 1. The substituted position of a substituent is not particularly limited. Furthermore, the number of substitutions is not limited, but it is preferably from 0 to 5.

Examples of the substituent of the mono-substituted amino group or di-substituted amino group include an unsubstituted or substituted linear, branched or cyclic alkyl group, and an unsubstituted or substituted aromatic hydrocarbon group or aromatic heterocyclic group. As the unsubstituted or substituted linear, branched or cyclic alkyl group, those having 1 to 16 carbon atoms are preferable. As the unsubstituted or substituted aromatic hydrocarbon group, the number of carbon atoms constituting a ring is preferably from 6 to 30. As the unsubstituted or substituted aromatic heterocyclic group, the number of carbon atoms constituting a ring is preferably from 3 to 30. Concrete examples of the unsubstituted or substituted aromatic hydrocarbon group or aromatic heterocyclic group include those illustrated in concrete examples of $Ar^1$ and $Ar^2$.

Concrete examples of the mono-substituted amino group and di-substituted amino group include an N-methylamino group, an N-ethylamino group, an N-phenylamino group, an N-(1-naphthyl)amino group, an N-(2-naphthyl)amino group, an N,N-dimethylamino group, an N,N-diethylamino group and an N,N-diphenylamino group. Among the mono-substituted amino group and di-substituted amino group, the mono-substituted amino group is preferable.

Y represents a divalent aromatic group having 4 to 30 carbon atoms, and includes a divalent aromatic hydrocarbon group or a divalent aromatic heterocyclic group. These groups may be unsubstituted or substituted. In case the group is an unsubstituted or substituted aromatic hydrocarbon group, the number of carbon atoms of the group is preferably from 6 to 30 and more preferably from 6 to 25. On the other hand, when the group is an unsubstituted or substituted aromatic heterocyclic group, the number of carbon atoms of the group is preferably from 4 to 30 and more preferably from 4 to 25.

Examples of the substituent of the substituted divalent aromatic hydrocarbon group or aromatic heterocyclic group in Y include a halogen atom, a linear, branched or cyclic alkyl group, an alkyloxy group having a linear, branched or cyclic alkyl group and a monovalent aromatic group.

Examples of the halogen atom include a fluorine atom, a chlorine atom, a bromine atom and an iodine atom. As the linear, branched or cyclic alkyl group, those having 1 to 8 carbon atoms are preferable. As the alkyloxy group having a linear, branched or cyclic alkyl group, those having a linear, branched or cyclic alkyl group having 1 to 8 carbon atoms are preferable. Furthermore, as the monovalent aromatic group, unsubstituted or substituted aromatic hydrocarbon groups and aromatic heterocyclic groups having 4 to 12 carbon atoms are preferable.

Examples of the divalent aromatic group in Y include a 1,4-phenylene group, a 1,3-phenylene group, a 2,5-thiophenediyl group, a 3,4-thiophenediyl group, a 2,5-furandiyl group, a 3,4-furandiyl group, a 2,5-pyrrolediyl group, a 3,4-pyrrolediyl group, a 2,6-pyridinediyl group, a 4,4'-biphenylene group (—$C_6H_4$—$C_6H_4$—), a triphenylene group (—$C_6H_4$—$C_6H_4$—$C_6H_4$—), a 1,4-naphthalenediyl group, a 1,5-naphthalenediyl group, a 2,6-naphthalenediyl group, a 9,10-anthracenediyl group, a 2,7-fluorenediyl group, a 3,6-fluorenediyl group, a 2,7-carbazolediyl group, a 3,6- carbazolediyl group, a 4,5-carbazolediyl group, a 2,8-dibenzothiophenediyl group, a 3,7-dibenzothiophenediyl group and the like.

As the divalent aromatic group in Y, a divalent aromatic hydrocarbon group (a divalent group made of an aromatic hydrocarbon group) is preferable. Particularly preferable examples of the group include a 1,4-phenylene group, a 1,4-naphthalenediyl group, a 4,4'-biphenylene group (—$C_6H_4$—$C_6H_4$—), a triphenylene group (—$C_6H_4$—$C_6H_4$—$C_6H_4$—) and a 2,7-fluorenediyl group.

The groups represented by the general formula (1b) is included in the group represented by —Y—, -A-B-A- (1b)

wherein, in the formula, A represents a divalent aromatic group; and —B— represents a single bond, —O—, —S—, —$CH_2$—, —$CMe_2$-, —CO—, —SO—, —$SO_2$—, —$SiH_2$—, —$SiMe_2$-, general formula (1c)

[Chemical Formula 11]

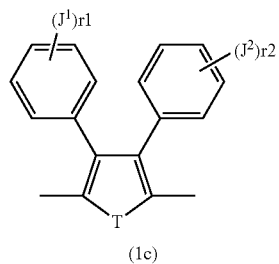

(1c)

wherein, in the formula, T represents an oxygen atom, a nitrogen atom or a sulfur atom; $J^1$ and $J^2$ each independently represents a hydrogen atom, a fluorine atom, a chlorine atom, a bromine atom, an iodine atom, a methyl group or a methoxy group; r1 and r2 each represents an integer of 0 to 5. T is preferably a sulfur atom. Furthermore, r1 and r2 are preferably an integer of 0 to 2 and more preferably an integer of 0 to 1. $J^1$ and $J^2$ are each the same substituent, and r1 and r2 are each particularly preferably the same integer.

A divalent aromatic hydrocarbon group or a divalent aromatic heterocyclic group is included in the divalent aromatic group represented by A. These groups may be unsubstituted or substituted. Examples of the group include a 1,4-phenylene group, a 1,3-phenylene group, a 2,5-thiophenediyl group, a 3,4-thiophenediyl group, a 2,5-furandiyl group, a 3,4-furandiyl group, a 2,5-pyrrolediyl group, a 3,4-pyrrolediyl group, a 2,6-pyridinediyl group and the like.

When A is a substituted aromatic group, examples of its substituent include a halogen atom such as a fluorine atom, a chlorine atom, a bromine atom, an iodine atom and the like; a linear, branched or cyclic alkyl group having 1 to 8 carbon atoms, an alkyloxy group having a linear, branched or cyclic alkyl group of 1 to 8 carbon atoms and a monovalent aromatic group having 4 to 12 carbon atoms.

The group represented by the general formula (1d) is also included in the group represented by —Y—, -A-B-A-B-A- (1d)

wherein, in the formula, A and B are the same as A and B in the aforementioned general formula (1b).

In the general formula (1), examples of the divalent aromatic group in W include the same as those in Y. However, as —W—, a group represented by the general formula (1e) is particularly preferable,

[Chemical Formula 12]

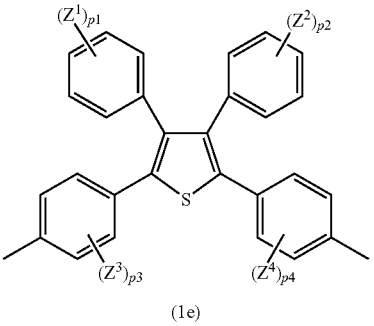

(1e)

wherein, in the formula, $Z^1$ to $Z^4$ and p1 to p4 are the same as those defined in the general formula (b-8).

As the sulfo group-containing polymer compound of the present invention, preferred is a sulfo group-containing polymer compound having at least one of repeating units in which $Ar^1$, $Ar^2$, Y and at least one of four benzene rings bonded to a thiophene ring are substituted with a sulfo group in a polymer chain, in the repeating unit represented by the general formula (2),

[Chemical Formula 13]

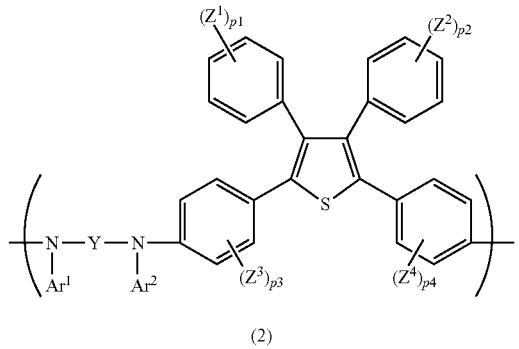

(2)

wherein, in the formula, $Ar^1$, $Ar^2$ and Y are the same as the general formula (1); $Z^1$ to $Z^4$ each represents a substituent; p1 and p2 each represents an integer of 0 to 5; p3 and p4 each represents an integer of 0 to 4.

The sulfo group-containing polymer compound can be obtained, for example, by sulfonating a polymer compound composed of repeating units represented by the general formula (2).

In the general formulae (2) and (1e), examples of the substituent represented by $Z^1$ to $Z^4$ include the same substituents on the aromatic hydrocarbon group or aromatic heterocyclic group of $Ar^1$ and $Ar^2$ in the general formula (1). p1 to p4 are preferably an integer of 0 to 2 and more preferably an integer of 0 to 1. Furthermore, preferably $Z^1$ to $Z^4$ are each the same substituent, and p1 to p4 are each the same integer.

A further preferable embodiment of the sulfo group-containing polymer compound of the present invention is a sulfo group-containing polymer compound having at least one of repeating units in which at least one of benzene rings is substituted with a sulfo group in a polymer chain, in the repeating unit represented by the general formula (3),

[Chemical Formula 14]

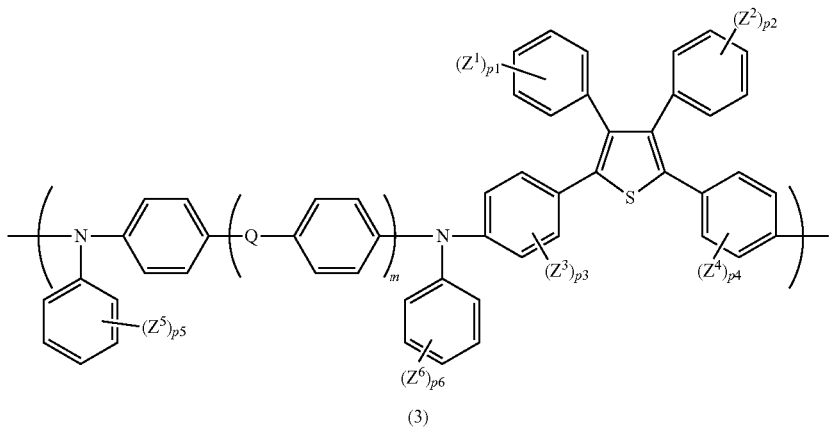

(3)

wherein, in the formula, $Z^1$ to $Z^4$ and p1 to p4 are the same as described above; $Z^5$ and $Z^6$ each represents a substituent; p5 and p6 each represents an integer of 0 to 5; m represents an integer of 0 to 2; and -Q- represents a group represented by a single bond, —O—, —S—, —$CH_2$—, —$CMe_2$-, —CO—, —SO—, —$SO_2$—, —$SiH_2$— or —$SiMe_2$-.

Examples of the substituent represented by $Z^5$ and $Z^6$ include the same as the substituents represented by $Z^1$ to $Z^4$. p5 and p6 are preferably an integer of 0 to 2 and more preferably an integer of 0 to 1.

Meanwhile, it is preferable that $Z^5$ and $Z^6$ are each the same substituent, and p5 and p6 are each the same integer. It is preferable that $Z^1$ to $Z^4$ are each the same substituent, and p1 to p4 are each the same integer.

Furthermore, another further preferable embodiment of the sulfo group-containing polymer compound of the present invention is a sulfo group-containing polymer compound having at least one of repeating units in which at least one of benzene rings and naphthalene rings is substituted with a sulfo group in a polymer chain, in the repeating unit represented by the general formula (3a), represents a group represented by a single bond, —O—, —S—, —$CH_2$—, —$CMe_2$-, —CO—, —SO—, —$SO_2$—, —$SiH_2$— or —$SiMe_2$-.

Furthermore, in the sulfo group-containing polymer compound formed by introducing sulfo groups into a polymer compound composed of repeating units represented by the general formula (1), salts may be formed. The salts are not particularly limited, but examples thereof include inorganic salts such as lithium, sodium, potassium, calcium, aluminum and the like; and salts with organic amines such as ammonia, trimethylamine, triethylamine, piperidine, morpholine and the like or amino acids.

Furthermore, the number average molecular weight of the polymer compound composed of repeating units represented by the general formula (1) is not particularly limited, but it is from 1,000 to 1,000,000, preferably from 3,000 to 500,000 and more preferably from 4,000 to 200,000 in terms of polystyrene.

Furthermore, the polymer compound composed of repeating units represented by the general formula (1) may be subjected to an end treatment by substituting an end func-

[Chemical Formula 15]

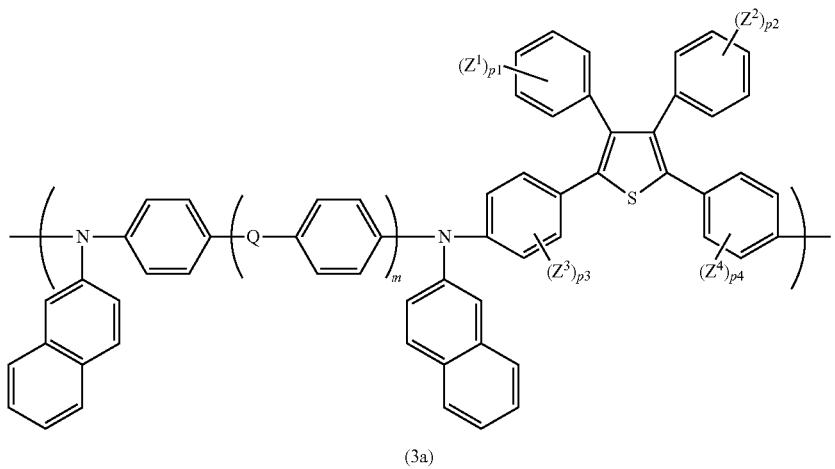

(3a)

wherein, in the formula, $Z^1$ to $Z^4$ and p1 to p4 are the same as described above; m represents an integer of 0 to 2; and -Q- tional group that is the polymerization reaction region with an unsubstituted or substituted aromatic hydrocarbon group, a di-substituted amino group, a linear, branched or cyclic alkyl group, an alkyloxy group having a linear, branched or cyclic alkyl group, a carboxyl group, an alkoxycarbonyl group, a hydroxyl group and the like.

Next, a process for producing the compound formed by introducing sulfo groups into a polymer compound composed of repeating units represented by the general formula (1) of the present invention will be described.

The polymer compound composed of repeating units represented by the general formula (1) that is a raw material can be produced, for example, by polymerizing a compound represented by the general formula (4) and a compound represented by the general formula (5) in the presence of a base with a Pd catalyst or the like, $$H-N(Ar^1)-Y-N(Ar^2)-H \quad (4)$$

wherein, in the formula, $Ar^1$, $Ar^2$ and Y are the same as the general formula (1), $$X^1-W-X^1 \quad (5)$$

wherein, in the formula, $X^1$ represents a halogen atom; and W represents the same as the general formula (1).

Examples of the halogen atom in $X^1$ include a fluorine atom, a chlorine atom, a bromine atom and an iodine atom.

Furthermore, the polymer compound composed of repeating units represented by the general formula (2) can be produced, for example, by polymerizing a compound represented by the foregoing general formula (4) and a compound represented by the general formula (6) in the presence of a base with a Pd catalyst or the like,

[Chemical Formula 16]

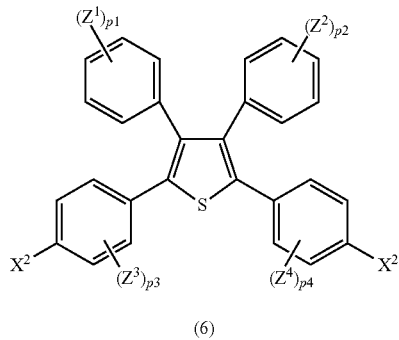

(6)

wherein, in the formula, $X^2$ represents a halogen atom; and $Z^1$ to $Z^4$ and p1 to p4 are the same as described above.

Examples of the halogen atom in $X^2$ include the same as those in $X^1$ of the general formula (5).

The sulfo group-containing polymer compound of the present invention can be produced, for example, by sulfonating the polymer compound composed of repeating units represented by the general formula (1).

Examples of the sulfonating agent used for the sulfonation include sulfuric acid, fuming sulfuric acid, sulfur trioxide, sulfur trioxide complex, chlorosulfuric acid, fluorosulfuric acid, amidosulfuric acid and the like. The amount of the sulfonating agent in use is not particularly limited.

The sulfur trioxide complex is a complex with Lewis acids such as ethers, amines, sulfides and the like, and examples thereof include N,N-dimethylformamide/sulfur trioxide complex, dioxane/sulfur trioxide complex, pyridine/sulfur trioxide complex, triethylamine/sulfur trioxide complex, trimethylamine/sulfur trioxide complex and the like.

The reaction can be carried out without a solvent or in a solvent. The solvent used for the reaction is not particularly limited as far as it does not have an influence on the reaction. Examples thereof include chlorinated organic solvents such as dichloromethane, chloroform, carbon tetrachloride, dichloroethane, tetrachloroethane and the like; liquid sulfur dioxide, carbon disulfide, acetic acid, acetic anhydride; esters such as ethyl acetate and the like; ethers such as diethyl ether and the like; benzene, toluene, xylene, nitromethane, nitrobenzene, n-butyl alcohol, isobutyl alcohol, tert-butyl alcohol, acetonitrile, tetrahydrofuran, dioxane, dimethylformamide, dimethylacetamide, 1,3-dimethyl-2-imidazolidinone, N-methylpyrrolidone and the like.

The reaction temperature may be selected in the range of −20 degree centigrade to 150 degree centigrade, while the reaction time is from several minutes to 96 hours. Furthermore, the sulfo group-containing polymer compound can also be obtained by synthesizing sulfonyl chloride from a chlorosulfuric acid and hydrolyzing the resultant.

A method for isolation of the polymer compound of the present invention is not particularly limited. When the product is precipitated from the reaction solvent, it can be isolated by leaching or centrifuging. When dissolved in the reaction solvent, there can be employed a method including removing the solvent under reduced pressure or a method including adding an appropriate solvent for precipitating, leaching or centrifuging.

When the reaction product forms sulfate, a sulfonating agent in an excess amount is removed by filtering and then washing with water. The sulfuric acid can be eliminated by subjecting the obtained sulfate to a neutralization treatment with a base. As the base, hydroxides of alkali metal, alkaline earth metal and the like or ion exchange resins can be used.

When the polymer compound of the present invention needs to be purified, a method which is well known as a usual method can be employed. Examples of the method include a recrystallization method, a reprecipitation method, column chromatography, washing by a solvent (sludge), an adsorption treatment using activated carbon and the like, an ion exchange resin treatment, a treatment method using an ion exchange membrane, a dialysis membrane, a reverse osmosis or an ultrafiltration membrane, and the like.

The organic electroluminescent material of the present invention will be described below.

The organic electroluminescent material of the present invention is made of the aforementioned sulfo group-containing polymer compound, for example, any of sulfo group-containing polymer compounds of the general formula (1), (2), (3) or (3a), and is a hole injection transport material, a luminescent material or an electron injection transport material used for an organic electroluminescent element.

The organic electroluminescent element of the present invention will be described below.

The organic electroluminescent element of the present invention is formed such that at least one of layers containing at least one kind of the sulfo group-containing polymer compounds of the present invention is held between a pair of electrodes. The organic electroluminescent element is usually formed such that at least one luminescent layer containing at least one kind of the luminescent components is held between a pair of electrodes. In consideration of each functional level of hole injection and hole transport, electron injection and electron transport of the compound used in the luminescent layer, a hole injection transport layer containing a hole injection component and/or an electron injection transport layer containing an electron injection component can also be formed as required.

For example, when a hole injection function, a hole transport function and/or an electron injection function and an electron transport function of a compound used in the luminescent layer are good, it is possible to provide an element in the form of one layer that the luminescent layer also serves as a hole injection transport layer and/or an electron injection transport layer. Furthermore, when the luminescent layer is in need of a hole injection function and/or a hole transport function, it is possible to provide an element in the form of two layers that a hole injection transport layer is provided on the anode side of the luminescent layer. When the luminescent layer is in need of an electron injection function and/or an electron transport function, it is possible to provide an element in the form of two layers that an electron injection transport layer is provided on the cathode side of the luminescent layer. Furthermore, it is also possible to provide an element in the form of three layers that the luminescent layer is held between a hole injection transport layer and an electron injection transport layer.

Further, each of the hole injection transport layer, the electron injection transport layer and the luminescent layer may be a monolayer structure or a multilayer structure. With respect to the hole injection transport layer and the electron injection transport layer, each layer can be formed such that a layer having an injection function and a layer having a transport function are provided separately.

In the organic electroluminescent element of the present invention, the sulfo group-containing polymer compound of the present invention is preferably used as a constituent component of an electric charge injection transport layer and/or a luminescent layer. Examples of the electric charge injection transport layer include a hole injection transport layer and an electron injection transport layer. A hole injection transport layer is more particularly preferable.

In the organic electroluminescent element of the present invention, the sulfo group-containing polymer compound of the present invention may be used either singly or in combination of a plurality thereof.

Figure 2:
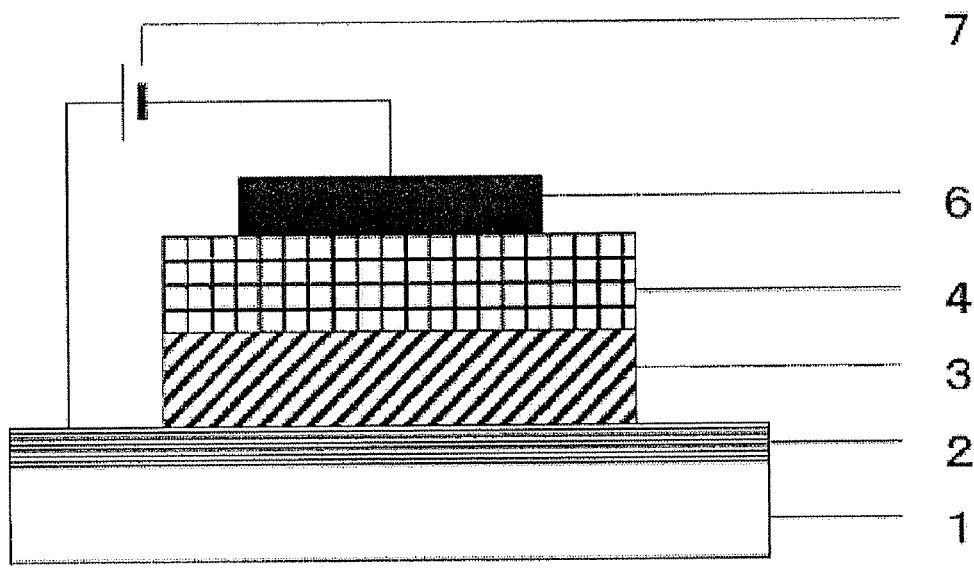
FIG. 2 is a schematic sectional view of one example of the organic electroluminescent element.
Figure 3:
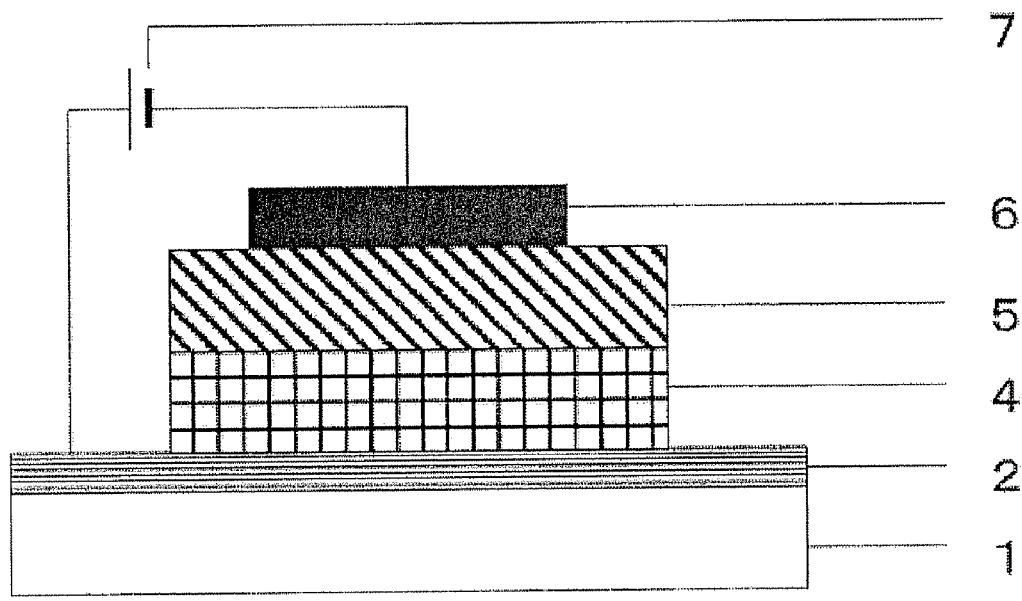
FIG. 3 is a schematic sectional view of one example of the organic electroluminescent element.
Figure 4:
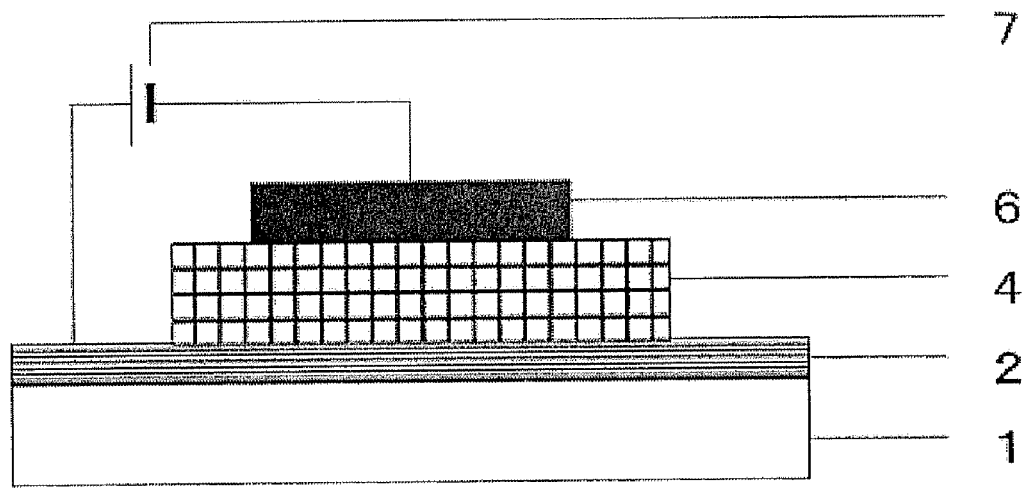
FIG. 4 is a schematic sectional view of one example of the organic electroluminescent element.
Figure 5:
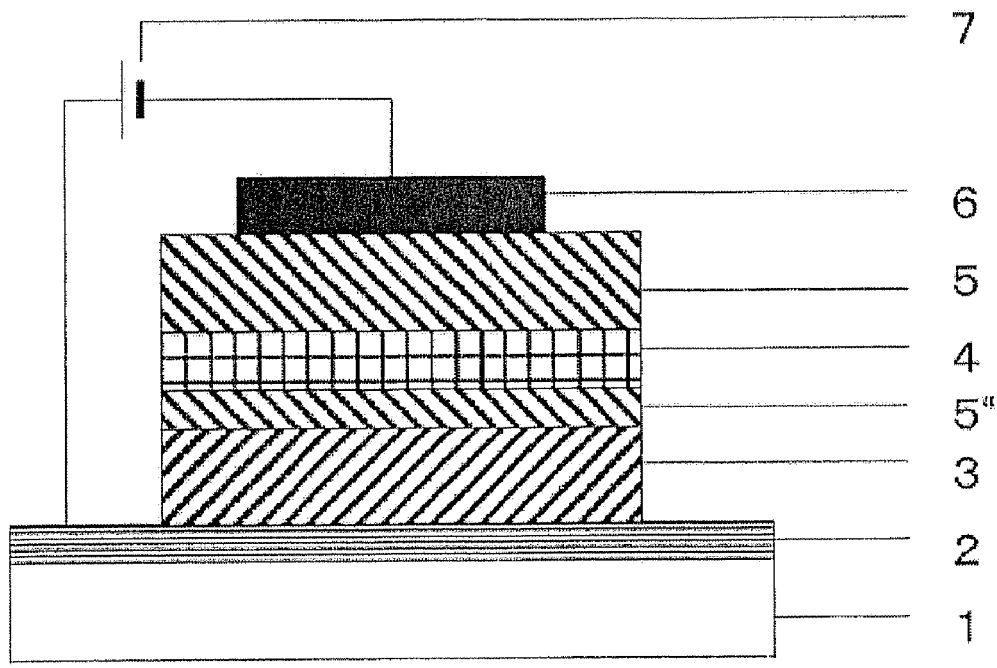
FIG. 5 is a schematic sectional view of one example of the organic electroluminescent element.
Figure 6:
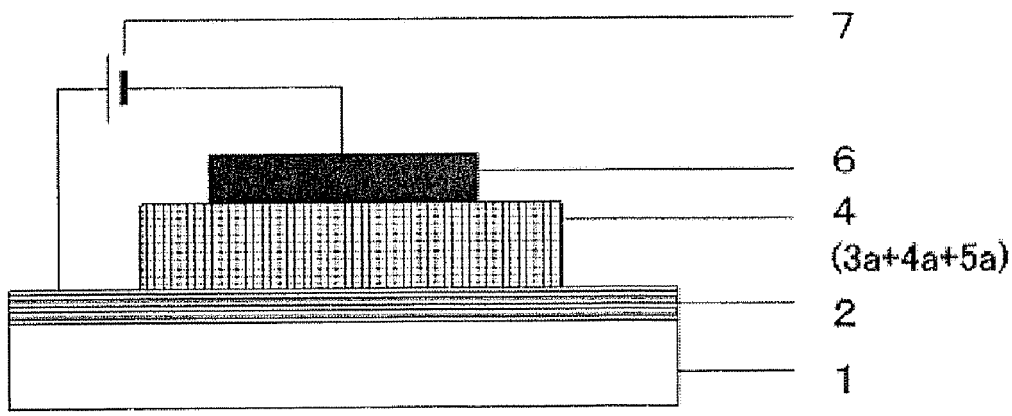
FIG. 6 is a schematic sectional view of one example of the organic electroluminescent element.
Figure 7:
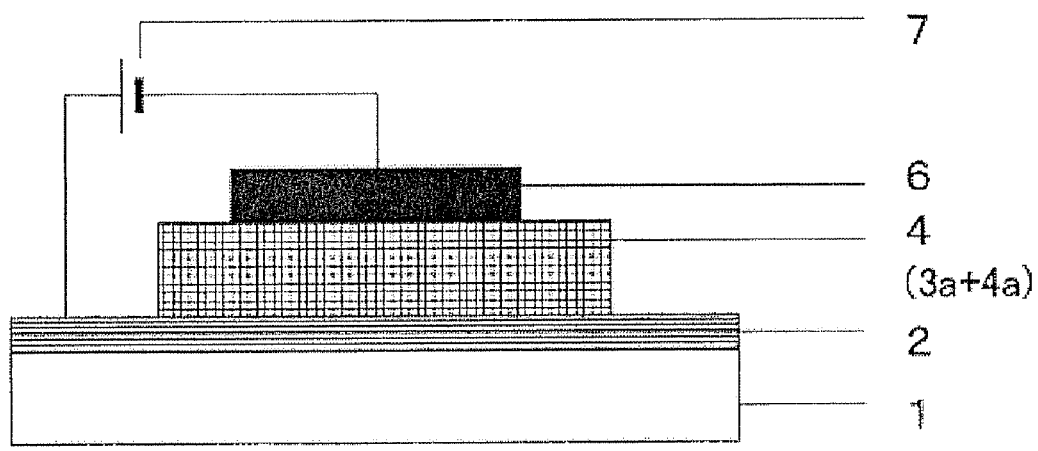
FIG. 7 is a schematic sectional view of one example of the organic electroluminescent element.
Figure 8:
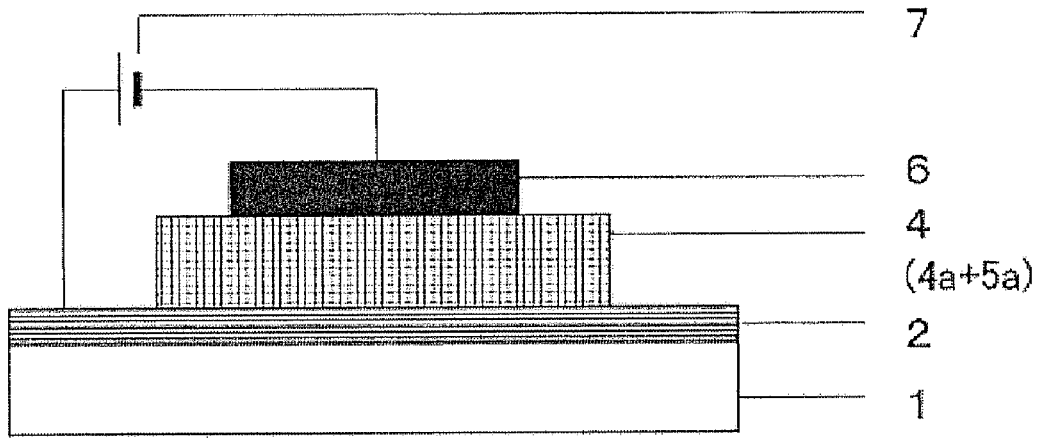
FIG. 8 is a schematic sectional view of one example of the organic electroluminescent element.

The structure of the organic electroluminescent element of the present invention is not particularly limited, and examples thereof include (EL-1) an anode/hole injection transport layer/luminescent layer/electron injection transport layer/cathode-type element (FIG. 1), (EL-2) an anode/hole injection transport layer/luminescent layer/cathode-type element (FIG. 2), (EL-3) an anode/luminescent layer/electron injection transport layer/cathode-type element (FIG. 3), (EL-4) an anode/luminescent layer/cathode-type element (FIG. 4) and the like. Furthermore, (EL-5) an anode/hole injection transport layer/electron injection transport layer/luminescent layer/electron injection transport layer/cathode-type element (FIG. 5) which is an element of a type with a luminescent layer held between electron injection transport layers can also be cited. Furthermore, the (EL-4) type element structure may be any of an element of a type with the luminescent component in the form of one layer held between a pair of electrodes as a luminescent layer, (EL-6) an element of a type in which a combination of a hole injection transport component, a luminescent component and an electron injection component in the form of one layer is held between a pair of electrodes as a luminescent layer (FIG. 6), (EL-7) an element of a type in which a combination of a hole injection transport component and a luminescent component in the form of one layer is held between a pair of electrodes as a luminescent layer (FIG. 7), and (EL-8) an element of a type in which a combination of a luminescent component and an electron injection component in the form of one layer is held between a pair of electrodes as a luminescent layer (FIG. 8).

The structure of the organic electroluminescent element of the present invention is not limited to these element structures. In each type of the element, a hole injection transport layer, a luminescent layer and an electron injection transport layer can be formed as plural layers. Further, in each type of the element, it is also possible that a combined layer of a hole injection transport component and a luminescent component is formed between a hole injection transport layer and a luminescent layer and/or a combined layer of a luminescent component and an electron injection transport component is formed between a luminescent layer and an electron injection transport layer.

With respect to the structure of the organic electroluminescent element, the (EL-1) type element, the (EL-2) type element, the (EL-5) type element, the (EL-6) type element or the (EL-7) type element is preferable, and the (EL-1) type element, the (EL-2) type element or the (EL-7) type element is more preferable.

The organic electroluminescent element of the present invention will be described in detail below. Incidentally, for example, (EL-1) the anode/hole injection transport layer/luminescent layer/electron injection transport layer/cathode-type element as shown in FIG. 1 is described.

In FIG. 1, 1 is a substrate, 2 an anode, 3a hole injection transport layer, 4a luminescent layer, 5 an electron injection transport layer, 6a cathode and 7a power supply.

It is preferable that the organic electroluminescent element of the present invention is supported by the substrate 1. The substrate is not particularly limited, but the substrate is preferably transparent or semitransparent. Examples thereof include substrates made of glasses such as a soda-lime glass, a borosilicate glass and the like, and transparent polymers such as polyester, polycarbonate, polysulfone, polyether sulfone, polyacrylate, polymethylmethacrylate, polypropylene, polyethylene and the like. Further, substrates made of a semitransparent plastic sheet, quarts, transparent ceramics and a composite sheet of a combination of these can also be used. Further, a luminescent color can also be controlled by combining the substrate with, for example, a color filter film, a color conversion film or a dielectric reflecting film.

In the anode 2, it is preferable to use a metal, an alloy or an electroconductive compound having a relatively large work function as an electrode material. Examples of the electrode material used in the anode include gold, platinum, silver, copper, cobalt, nickel, palladium, vanadium, tungsten, indium oxide ($In_2O_3$), tin oxide ($SnO_2$) zinc oxide, ITO (indium tin oxide), polythiophene, polypyrrole and the like. These electrode materials may be used either singly or in combination of a plurality thereof. The anode can be formed on the substrate, for example, by a method such as a deposition method, a sputtering method or the like using these electrode materials. Further, the anode may be a monolayer structure or a multilayer structure. A sheet electric resistance of the anode is preferably set at not more than several hundreds of ohms and more preferably set at from about 5 to 50 ohms. A thickness of the anode varies depending on the electrode material in use. It is generally set at from about 5 to 1,000 nm and more preferably from about 10 to 500 nm.

The hole injection transport layer 3 is a layer containing a compound having a function of facilitating injection of holes from the anode and a function of transporting holes injected.

The hole injection transport layer of the electroluminescent element of the present invention can be formed using at least one kind of the sulfo group-containing polymer compounds of the present invention and/or other compounds having a hole injection transport function (for example, phthalocyanine derivatives, triarylamine derivatives, triarylmethane derivatives, oxazole derivatives, hydrazone derivatives, stilbene derivatives, pyrazoline derivatives, polysilane derivatives, polyphenylenevinylene and its derivatives, polythiophene and its derivatives, poly-N-vinylcarbazole and the like). The compounds having the hole injection transport function may be used either singly or in combination of a plurality thereof.

The organic electroluminescent element of the present invention preferably contains the sulfo group-containing polymer compound of the present invention in the hole injection transport layer. In the organic electroluminescent element of the present invention, more preferable examples of other compounds having the hole injection transport function which can be used include triarylamine derivatives (for example, 4,4'-bis[N-phenyl-N-(4"-methylphenyl)amino]-1,1'-biphenyl, 4,4'-bis[N-phenyl-N-(3'-methylphenyl)amino]-1,1'-biphenyl, 4,4'-bis[N-phenyl-N-(3"-methoxyphenyl)amino]-1,1'-biphenyl, 4,4'-bis[N-phenyl-N-(1"-naphthyl)amino]-1,1'-biphenyl, 3,3'-dimethyl-4,4'-bis[N-phenyl-N-(3"-methylphenyl)amino]-1,1'-biphenyl, 1,1-bis[4'-[N,N-di(4"-methylphenyl)amino]phenyl]cyclohexane, 9,10-bis[N-(4'-methylphenyl)-N-(4"-n-butylphenyl)amino]phenanthrene, 3,8-bis(N,N-diphenylamino)-6-phenylphenanthridine, 4-methyl-N,N-bis[4",4"'-bis[N',N'-di(4-methylphenyl)amino]biphenyl-4-yl]aniline, N,N'-bis[4-(diphenylamino)phenyl]-N,N'-diphenyl-1,3-diaminobenzene, N,N'-bis[4-(diphenylamino)phenyl]-N,N'-diphenyl-1,4-diaminobenzene, 5,5"-bis[4-(bis[4-methylphenyl]amino]phenyl-2,2':5',2"-terthiophene, 1,3,5-tris(diphenylamino)benzene, 4,4',4"-tris(N-carbazolyl)triphenylamine, 4,4',4"-tris[N,N-bis(4'"-tert-butylbiphenyl-4""-yl)amino]triphenylamine, 1,3,5-tris[N-(4'-diphenyl)amino]benzene and the like, polythiophene and its derivatives, and poly-N-vinylcarbazole and its derivatives.

When the sulfo group-containing polymer compound of the present invention and the other compounds having the hole injection transport function are used in combination, the content of the sulfo group-containing polymer compound of the present invention that are occupied in the hole injection transport layer is preferably not less than 0.1 mass %, more preferably from 0.5 to 99.9 mass % and further preferably from 3 to 97 mass %.

Meanwhile, when the sulfo group-containing polymer compound of the present invention and the other compounds having the hole injection transport function are used in combination, a layer made of the sulfo group-containing polymer compound of the present invention and a layer made of the other compounds having the hole injection transport function may also be stacked. In case of stack, it is preferable to stack the layer made of the other compounds having the hole injection transport function on the layer made of the sulfo group-containing polymer compound of the present invention.

Furthermore, in the hole injection transport layer, a compound having a hole injection transport function and an electron accepting compound may be used in combination. Examples of the electron accepting compound include TBPAH (tris(4-bromophenyl)aluminum hexachloroantimonate) as described in Japanese Patent Laid-open No. 11 (1999)-283750 as well as Lewis acids such as $FeCl_3$ and boron compounds including tris(pentafluorophenyl)borane as described in Japanese Patent Laid-open No. 2003-31365. When the electron accepting compound is used in combination, the content of the electron accepting compound is preferably in the range of 0.1 to 50 weight % based on the hole injection transport layer.

The luminescent layer 4 is a layer containing a compound having a hole and electron injection function, their transport function and a function of generating excitons by recombination of holes and electrons.

The luminescent layer can be formed using at least one of the sulfo group-containing polymer compounds of the present invention and/or other compounds having a luminescent function.

Examples of other compounds having a luminescent function include acridone derivatives, quinacridone derivatives, diketo pyrrolopyrrole derivatives, polycyclic aromatic compounds [for example, rubrene, anthracene, tetracene, pyrene, perylene, chrysene, decacyclene, coronene, tetraphenylcyclopentadiene, pentaphenylcyclopentadiene, 9,10-diphenylanthracene, 9,10-bis(phenylethynyl)anthracene, 1,4-bis(9'-ethynylanthracenyl)benzene, 4,4'-bis(9"-ethynylanthracenyl)biphenyl and dibenzo[f,f]diindeno[1,2,3-cd:1',2',3'-lm]perylene derivatives], triarylamine derivatives (for example, the foregoing compounds can be mentioned as a compound having a hole injection transport function), organic metal complexes [for example, tris(8-quinolinolato)aluminum, bis(10-benzo[h]quinolinolato)beryllium, 2-(2'-hydroxyphenyl)benzothiazole zinc salt, 4-hydroxyacridine zinc salt, 3-hydroxyflavone zinc salt, 5-hydroxyflavone beryllium salt and 5-hydroxyflavone aluminum salt], stilbene derivatives [for example, 1,1,4,4-tetraphenyl-1,3-butadiene, 4,4'-bis(2,2-diphenylvinyl)biphenyl and 4,4'-bis[(1,1,2-triphenyl)ethenyl]biphenyl], coumarin derivatives (for example, coumarin 1, coumarin 6, coumarin 7, coumarin 30, coumarin 106, coumarin 138, coumarin 151, coumarin 152, coumarin 153, coumarin 307, coumarin 311, coumarin 314, coumarin 334, coumarin 338, coumarin 343 and coumarin 500), pyran derivatives (for example, DCM1 and DCM2), oxazone derivatives (for example, Nile Red), benzothiazole derivatives, benzoxazole derivatives, benzimidazole derivatives, pyrazine derivatives, cinnamate ester derivatives, poly-N-vinylcarbazole and its derivatives, polythiophene and its derivatives, polyphenylene and its derivatives, polyfluorene and its derivatives, polyphenylenevinylene and its derivatives, polybiphenylenevinylene and its derivatives, polyterphenylenevinylene and its derivatives, polynaphthylenevinylene and its derivatives, polythienylenevinylene and its derivatives, and the like. In particular, preferred are acridone derivatives, quinacridone derivatives, polycyclic aromatic compounds, triarylamine derivatives, organic metal complexes and stilbene derivatives, and more preferred are polycyclic aromatic compounds and organic metal complexes.

The organic electroluminescent element of the present invention preferably contains the sulfo group-containing polymer compound of the present invention in the luminescent layer.

When the sulfo group-containing polymer compound of the present invention and other compounds having the luminescent function are used in combination, the ratio of the sulfo group-containing polymer compound of the present invention occupied in the luminescent layer is preferably adjusted to 0.001 to 99.999 mass %.

Furthermore, the luminescent layer can also be formed of a host compound and a guest compound (dopant) as described in J. Appl. Phys., 65, 3610 (1989) and Japanese Patent Laid-Open No. 5 (1993)-214332.

The luminescent layer can be formed by using the sulfo group-containing polymer compound of the present invention as a host compound or as a guest compound. When the luminescent layer is formed by using the sulfo group-containing polymer compound of the present invention as a host compound, as the guest compound, for example, the foregoing other compounds having the luminescent function can be mentioned. Of the compounds, preferred are polycyclic aromatic compounds.

When the luminescent layer is formed by using the sulfo group-containing polymer compound of the present invention as a host compound, the guest compound is preferably used in the amount of from 0.001 to 40 mass %, more preferably from 0.01 to 30 mass % and further preferably from 0.1 to 20 mass % based on the host compound. The luminescent layer can be formed by using the sulfo group-containing polymer compound of the present invention as a host material, and using at least one kind of the other compounds having a luminescent function as a guest material.

The organic electroluminescent element of the present invention preferably contains the sulfo group-containing polymer compound of the present invention in the luminescent layer as a host material.

When the sulfo group-containing polymer compound of the present invention as a host material and the other compounds having a luminescent function are used in combination, the sulfo group-containing polymer compound of the present invention occupied in the luminescent layer is preferably from 40.0 to 99.9 mass % and more preferably from 60.0 to 99.9 mass %.

The amount of the guest material used is from 0.001 to 40 mass %, preferably from 0.05 to 30 mass % and more preferably from 0.1 to 20 mass %, based on the sulfo group-containing polymer compound of the present invention. Furthermore, the guest material may be used either singly or in combination of a plurality thereof.

When the luminescent layer is formed by using the sulfo group-containing polymer compound of the present invention as a guest material, as the host material, preferred are polycyclic aromatic compounds, triarylamine derivatives, organic metal complexes and stilbene derivatives, and more preferred are polycyclic aromatic compounds and organic metal complexes.

When the sulfo group-containing polymer compound of the present invention is used as a guest material, the compound is preferably used in the amount of from 0.001 to 40 mass %, more preferably in the amount of from 0.01 to 30 mass %, and further preferably in the amount of from 0.1 to 20 mass %.

The electron injection transport layer 5 is a layer containing a compound having a function of facilitating injection of electrons from a cathode and/or a function of transporting electrons injected.

Examples of the compound having an electron injection function for use in the electron injection transport layer include organic metal complexes, oxadiazole derivatives, triazole derivatives, triazine derivatives, perylene derivatives, quinoline derivatives, quinoxaline derivatives, diphenylquinone derivatives, nitro-substituted fluorenone derivatives, thiopyran dioxide derivatives and the like. Furthermore, examples of the organic metal complexes include organic aluminum complexes such as tris(8-quinolinolato)aluminum and the like; organic beryllium complexes such as bis(10-benzo[h]quinolinolato)beryllium and the like; 5-hydroxyflavone beryllium salt, 5-hydroxyflavone aluminum salts and the like. Preferred are organic aluminum complexes and more preferred are organic aluminum complexes having an unsubstituted or substituted 8-quinolinolato ligand. Examples of the organic aluminum complexes having an unsubstituted or substituted 8-quinolinolato ligand include compounds represented by the general formulae (a) to (c),

(a)

wherein, in the formula, E represents an unsubstituted or substituted 8-quinolinolato ligand,

(b)

wherein, in the formula, E represents the same as above; O-M represents a phenolate ligand; and M represents a hydrocarbon group of 6 to 24 carbon atoms having a phenyl group,

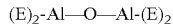

(c)

wherein, in the formula, E represents the same as above.

Specific examples of the organic aluminum complexes having an unsubstituted or substituted 8-quinolinolato ligand include tris(8-quinolinolato)aluminum, tris(4-methyl-8-quinolinolato)aluminum, tris(5-methyl-8-quinolinolato)aluminum, tris(3,4-dimethyl-8-quinolinolato)aluminum, tris(4,5-dimethyl-8-quinolinolato)aluminum, tris(4,6-dimethyl-8-quinolinolato)aluminum, bis(2-methyl-8-quinolinolato)(phenolate)aluminum, bis(2-methyl-8-quinolinolato)(2-methylphenolate)aluminum, bis(2-methyl-8-quinolinolato)(3-methylphenolate)aluminum, bis(2-methyl-8-quinolinolato)(4-methylphenolate)aluminum, bis(2-methyl-8-quinolinolato)(2-phenylphenolate)aluminum, bis(2-methyl-8-quinolinolato)(3-phenylphenolate)aluminum, bis(2-methyl-8-quinolinolato)(4-phenylphenolate)aluminum, bis(2-methyl-8-quinolinolato)(2,3-dimethylphenolate)aluminum, bis(2-methyl-8-quinolinolato)(2,6-dimethylphenolate)aluminum, bis(2-methyl-8-quinolinolato)(3,4-dimethylphenolate)aluminum, bis(2-methyl-8-quinolinolato)(3,5-dimethylphenolate)aluminum, bis(2-methyl-8-quinolinolato)(3,5-di-tert-butylphenolate)aluminum, bis(2-methyl-8-quinolinolato)(2,6-diphenylphenolate)aluminum, bis(2-methyl-8-quinolinolato)(2,4,6-triphenylphenolate)aluminum, bis(2-methyl-8-quinolinolato)(2,4,6-trimethylphenolate)aluminum, bis(2-methyl-8-quinolinolato)(2,4,5,6-tetramethylphenolate)aluminum, bis(2-methyl-8-quinolinolato)(1-naphtholato)aluminum, bis(2-methyl-8-quinolinolato)(2-naphtholato)aluminum, bis(2,4-dimethyl-8-quinolinolato)(2-phenylphenolate)aluminum, bis(2,4-dimethyl-8-quinolinolato)(3-phenylphenolate)aluminum, bis(2,4-dimethyl-8-quinolinolato)(4-phenylphenolate)aluminum, bis(2,4-dimethyl-8-quinolinolato)(3,5-dimethylphenolate)aluminum, bis(2,4-dimethyl-8-quinolinolato)(3,5-di-tert-butylphenolate)aluminum, bis(2-methyl-8-quinolinolato)aluminum-μ-oxo-bis(2-methyl-8-quinolinolato)aluminum, bis(2,4-dimethyl-8-quinolinolato)aluminum-μ-oxo-bis(2,4-dimethyl-8-quinolinolato)aluminum, bis(2-methyl-4-ethyl-8-quinolinolato)aluminum-μ-oxo-bis(2-methyl-4-ethyl-8-quinolinolato)aluminum, bis(2-methyl-4-methoxy-8-quinolinolato)aluminum-μ-oxo-bis(2-methyl-4-methoxy-8-quinolinolato)aluminum, bis(2-methyl-5-cyano-8-quinolinolato)aluminum-μ-oxo-bis(2-methyl-5-cyano-8-quinolinolato)aluminum and bis(2-methyl-5-trifluoromethyl-8-quinolinolato)aluminum-μ-oxo-bis(2-methyl-5-trifluoromethyl-8-quinolinolato)aluminum.

The compounds having an electron injection function may be used either singly or in combination of a plurality thereof.

As the cathode 6, a metal, an alloy or an electroconductive compound having a relatively small work function is preferably used as an electrode material. Examples of the electrode material used in the cathode include lithium, a lithium-indium alloy, sodium, a sodium-potassium alloy, calcium, magnesium, a magnesium-silver alloy, a magnesium-indium alloy, indium, ruthenium, titanium, manganese, yttrium, aluminum, an aluminum-lithium alloy, an aluminum-calcium alloy, an aluminum-magnesium alloy, lithium fluoride and a graphite thin film. These electrode materials may be used either singly or in combination of a plurality thereof.

The cathode can be formed on the electron injection transport layer, for example, by a method such as a deposition method, a sputtering method, an ionization deposition method, an ion plating method or a cluster ion beam method using these electrode materials.

Further, the cathode may be a monolayer structure or a multilayer structure. A sheet electric resistance of the cathode is preferably not more than several hundreds of ohms. A thickness of the cathode varies depending on the electrode material in use, but it is generally from 5 to 1,000 nm and preferably 10 to 500 nm. In order to take out emitted light of the organic electroluminescent element of the present invention at good efficiency, it is preferable that at least one electrode of the anode and the cathode is transparent or semitransparent. In general, it is more preferable to set the material of the anode or the cathode and its thickness such that a transmission of emitted light reaches not less than 70%.

Further, in the organic electroluminescent element of the present invention, at least one layer of the hole injection transport layer, the luminescent layer and the electron injection transport layer may contain a singlet oxygen quencher. The singlet oxygen quencher is not particularly limited. Examples thereof include rubrene, a nickel complex, and diphenylisobenzofuran. Rubrene is preferable.

The layer containing the singlet oxygen quencher is not particularly limited. It is preferably a luminescent layer or a hole injection transport layer and more preferably a hole injection transport layer. By the way, for example, when the hole injection transport layer contains the singlet oxygen quencher, it may uniformly be contained in the hole injection transport layer or in the vicinity of a layer adjacent to the hole injection transport layer (for example, the luminescent layer or the electron injection transport layer having a luminescent function). The content of the singlet oxygen quencher is from 0.01 to 50 mass %, preferably from 0.05 to 30 mass % and more preferably from 0.1 to 20 mass % of the total amount of the layer (for example, the hole injection transport layer) containing the same.

A method for forming the hole injection transport layer, the luminescent layer or the electron injection transport layer is not particularly limited. Examples thereof include a vacuum deposition method, an ionization deposition method or a solution coating method (for example, a spin coating method, a casting method, a micro gravure coating method, a gravure coating method, a bar coating method, a wire bar coating method, a dip coating method, a roll coating method, a spray coating method, a Langmuir-Blodgett method, a screen printing method, a flexo printing method, an offset printing method and an ink jet printing method). When each layer of the hole injection transport layer, the luminescent layer, the electron injection transport layer and the like is formed by a vacuum deposition method, the conditions for the vacuum deposition are not particularly limited. It is preferable to perform the same usually under vacuum of not more than about $10^{-3}$ Pa at a boat temperature (deposition source temperature) of about 50 to 500 degree centigrade, a substrate temperature of −50 to 300 degree centigrade and a deposition rate of about 0.005 to 50 nm/sec. In this case, it is preferable that each layer of the hole injection transport layer, the luminescent layer, the electron injection transport layer and the like is continuously formed in vacuo. The organic electroluminescent element which is excellent in general properties by being continuously formed can be produced. When each layer of the hole injection transport layer, the luminescent layer, the electron injection transport layer and the like is formed by the vacuum deposition method using a plurality of compounds, it is preferable to conduct co-deposition by separately controlling temperatures of boats filled with the compounds.

When each layer is formed by a solution coating method, the component constituting each layer or the component, a binder resin and the like are dissolved or dispersed in a solvent to form a coating solution. Examples of the solvent include an organic solvent (hydrocarbon solvents such as hexane, octane, decane, toluene, xylene, ethylbenzene, 1-methyl-naphthalene and the like; ketone solvents such as acetone, methyl ethyl ketone, methyl isobutyl ketone, cyclohexanone and the like; halogenated hydrocarbon solvents such as dichloromethane, chloroform, tetrachloromethane, dichloroethane, trichloroethane, tetrachloroethane, chlorobenzene, dichlorobenzene, chlorotoluene and the like; ester solvents such as ethyl acetate, butyl acetate, amyl acetate, ethyl lactate and the like; alcohol solvents such as methanol, propanol, butanol, pentanol, hexanol, cyclohexanol, methyl cellosolve, ethyl cellosolve, ethylene glycol, fluoride-containing alcohol and the like; ether solvents such as dibutyl ether, tetrahydrofuran, dioxane, dimethoxyethane, anisole and the like; polar solvents such as N,N-dimethylformamide, N,N-dimethylacetamide, 1-methyl-2-pyrrolidone, 1,3-dimethyl-2-imidazolidinone, dimethyl sulfoxide and the like), and water. The solvent may be used either singly or in combination of a plurality thereof. When the component in each layer of the hole injection transport layer, the luminescent layer and the electron injection transport layer is dispersed in a solvent, as the dispersion method, there can be used a method in which the dispersion is conducted in the form of fine particles using a ball mill, a sand mill, a paint shaker, an attritor, a homogenizer or the like.

When the sulfo group-containing polymer compound of the present invention is insoluble in a hydrocarbon solvent such as toluene or the like, the stack can be conducted by coating the upper layer using a hydrocarbon solvent. In particular, when the polymer compound is used as a hole injection transport layer, the stack can be conducted by coating the luminescent layer, which is advantageous in the foregoing structure of the organic electroluminescent element (EL-2).

Meanwhile, examples of the binder resin that can be used in each layer of the hole injection transport layer, the luminescent layer, the electron injection transport layer and the like include polymer compounds such as poly-N-vinylcarbazole, polyarylate, polystyrene, polyester, polysiloxane, polymethyl methacrylate, polymethyl acrylate, polyether, polycarbonate, polyamide, polyimide, polyamide-imide, poly-p-xylene, polyethylene, polyphenylene oxide, polyether sulfone, polyaniline and its derivatives, polythiophene and its derivatives, polyphenylenevinylene and its derivatives, polyfluorene and its derivatives, polythienylenevinylene and its derivatives, and the like. The binder resin may be used either singly or in combination of a plurality thereof. The concentration of the coating solution is not particularly limited. It can be set at a range suited for preparing a desired thickness according to a coating method to be performed. The concentration of the solution is generally set at 0.1 to 50 mass % and preferably at 0.5 to 30 mass %. In case of using the binder resin, its amount used is not particularly limited. It is usually used such that the content rate of the binder resin is from 5 to 99.9 mass % and preferably from 10 to 99 mass % based on the total amount of the component constituting each layer of the hole injection transport layer, the luminescent layer, the electron injection transport layer and the like, and the binder resin (based on the total amount of each component when forming an element of one layer).

A film thickness of each layer of the hole injection transport layer, the luminescent layer, the electron injection transport layer and the like is not particularly limited. It is usually from 5 nm to 5 µm.

Incidentally, for preventing contact of the organic electroluminescent element of the present invention produced under the foregoing conditions with oxygen or moisture and the like, it is possible to form a protecting layer (sealing layer) or to protect the element by sealing the same in an inactive substance (for example, paraffin, liquid paraffin, silicon oil, fluorocarbon oil and zeolite-containing fluorocarbon oil). Examples of the material used in the protecting layer include organic polymer materials (for example, a fluorinated resin, an epoxy resin, a silicone resin, an epoxy silicone resin, polystyrene, polyester, polycarbonate, polyamide, polyimide, polyamide-imide, poly-p-xylene, polyethylene and polyphenylene oxide), inorganic materials (for example, a diamond thin film, an amorphous silica, an electric insulating glass, a metal oxide, a metal nitride, a metal carbide and a metal sulfide), and photosetting resins. The materials used in the protecting layer may be used either singly or in combination of a plurality thereof. The protecting layer may be a monolayer structure or a multilayer structure.

Further, in the organic electroluminescent element of the present invention, a metal oxide film (for example, an aluminum oxide film) or a metal fluoride film can also be formed on the electrode as a protecting layer.

In the organic electroluminescent element of the present invention, an interfacial layer (intermediate layer) can also be formed on the surface of the anode. Examples of the material of the interfacial layer include an organic phosphorus compound, polysilane, aromatic amine derivatives, phthalocyanine derivatives and the like.

Furthermore, the electrode, for example, the anode or its surface can also be used by being treated with an acid, ammonia/hydrogen peroxide or plasma.

The organic electroluminescent element of the present invention can be generally used as a direct current driving-type element, and can also be used as an alternating current driving-type element. Further, the organic electroluminescent element of the present invention may be a passive driving type such as a segment type, a simple matrix driving type or the like, or an active driving type such as a TFT (thin film transistor) type, an MIM (metal-insulator-metal) type or the like. A driving voltage is generally from 2 to 30 V. The organic electroluminescent element of the present invention can be used in panel-type light sources (for example, back lights of watches, liquid crystal panels and the like), various luminescent elements (for example, substitution of luminescent elements such as LED and the like), various display devices [for example, information display elements (personal computer monitors, display elements for cellular phones and portable terminals)], various marks, various sensors and the like.

Furthermore, the sulfo group-containing polymer compound of the present invention can also be used for the purposes of organic semiconductors, organic thin film transistors (TFT), electrolytic capacitors, photoelectric conversion elements, electrochromic displays (ECD), anti-static agents and the like in which conventional electroconductive polymer materials (PEDOT/PSS) are used.

EXAMPLES

The present invention is now illustrated in detail below with reference to Examples. However, the present invention is not restricted to the following Examples.

Incidentally, the molecular weight in each Example was obtained by measuring the number average molecular weight in terms of polystyrene by the gel permeation chromatography (GPC).

The number of sulfo groups was determined by the elementary analysis.

(GPC Analytical Conditions)
Device: Gel Permeation Chromatography GPC 101 (a product of Shodex)
Detector: Differential Refractive Index Meter
Column: GPC K-806LX3 (8.0 mmI.D.×30 cm, a product of Shodex)
Column Temperature: 40 degree centigrade
Solvent: Chloroform
Amount Introduced: 100 µl
Flow Rate: 1 ml/min
Reference Material Monodispersed Polystyrene (a product of Shodex)
(NMR Analytical Conditions)
Device: ECP500 Nuclear Magnetic Resonance Apparatus manufactured by JEOL Ltd.
Measurement Nucleus: $^{13}$C (125 MHz)
Measurement Temperature: 45 degree centigrade
Measurement Solvent: $CDCl_3$
(Glass Transition Temperature)
It was measured by using a differential scanning calorimetry DSC-60 manufactured by Shimadzu Corporation.
(UV (λmax))
It was measured by using an ultraviolet and visible spectrophotometer UV-2500PC manufactured by Shimadzu Corporation.

Example 1

(In the repeating unit represented by the formula (7), a sulfo group-containing polymer compound having at least one of repeating units in which at least one of benzene rings was substituted with a sulfo group in a polymer chain)

[Chemical Formula 17]

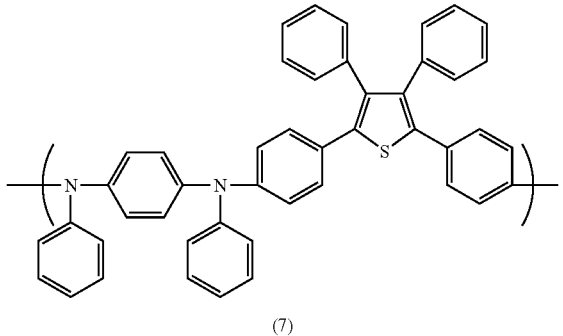

(7)

To a mixture of 5.31 g of N,N'-diphenyl-1,4-phenylene diamine, 11.15 g of 2,5-bis(4'-bromophenyl)-3,4-diphenyl thiophene, 4.86 g of sodium tert-butoxide and 300 mL of o-xylene was added an o-xylene (2 mL) solution of 92 mg of tris(dibenzylideneacetone)dipalladium and 162 mg of tri-tert-butylphosphine under a nitrogen flow. In a nitrogen atmosphere, the resulting mixture was stirred at 135 degree centigrade for 20 hours to remove the insoluble portion by hot filtering. The filtrate was returned to room temperature and poured into 600 mL of acetone for leaching the precipitate. The obtained solid was washed with acetone and water, and dissolved in toluene. This solution was poured into acetone, and the precipitate was leached and vacuum dried to obtain 11.56 g of a compound composed of repeating units of the formula (7) as a yellow solid.

Molecular Weight: 9,800

$^{13}$C-NMR: 147.2, 142.8, 139.0, 137.6, 137.0, 130.9, 129.6, 129.2, 127.8, 127.7, 126.5, 125.6, 124.6, 123.0, 122.3 ppm

Example 2

(In the repeating unit represented by the formula (8), a sulfo group-containing polymer compound having at least one of repeating units in which at least one of benzene rings was substituted with a sulfo group in a polymer chain)

[Chemical Formula 18]

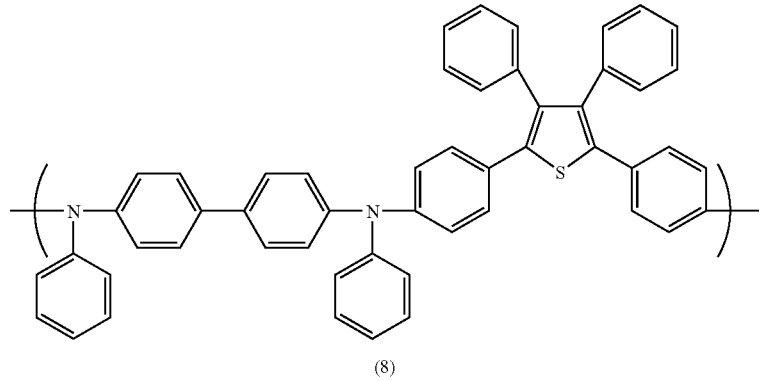

(8)

Glass Transition Temperature: 250 degree centigrade

UV (λmax): 382 (CHCl$_3$)

3.00 g of the polymer compound composed of repeating units of the formula (7) was introduced to 30 ml of 98% sulfuric acid under a nitrogen flow, and the resulting mixture was stirred at room temperature for 17 hours. The reaction solution was poured into 300 ml of pure water for leaching the precipitate. The obtained solid was washed with pure water until the pH of the filtrate became 5 and vacuum dried at 60 degree centigrade for 8 hours to obtain 4.08 g of a crude product as a brown solid. 4.08 g of the crude product was dissolved in 160 ml of 50% methanol water, 20 ml of an anion exchange resin (Dowex 1×8) treated with 1 mol/L sodium hydroxide water in advance was added thereto, and the mixture was stirred at room temperature for 5 hours. The ion exchange resin was filtered off, and then the filtrate was concentrated to dryness and vacuum dried at 60 degree centigrade for 7 hours. The obtained solid was dissolved in 100 ml of methanol and reprecipitated with 200 ml of toluene to obtain 3.67 g of a desired compound as a brown solid. The compound was dissolved in methanol, but not dissolved in toluene. Furthermore, in the compound, cohesiveness was not observed in a solution state.

Incidentally, the average number of sulfo groups per a repeating unit was calculated from the following equation.

Average number of sulfo groups={Molecular weight of repeating unit of the formula (7)×Elementary analytical value of sulfur (%)−Number of sulfurs in repeating unit of the formula (7)×Amount of sulfur atom×100}÷{Amount of sulfur atom× 100−Elementary analytical value of sulfur (%)× (Molecular weight of sulfo group−Amount of hydrogen atom)}

Elementary analytical value of sulfur: 11.3%

Average number of sulfo groups per repeating unit: 1.8

UV (λmax): 380 (MeOH)

To a mixture of 3.43 g of N,N'-diphenyl benzidine, 5.57 g of 2,5-bis(4'-bromophenyl)-3,4-diphenyl thiophene, 2.43 g of sodium tert-butoxide and 200 mL of o-xylene was added an o-xylene (1 mL) solution of 46 mg of tris(dibenzylideneacetone)dipalladium and 81 mg of tri-tert-butylphosphine under a nitrogen flow. In a nitrogen atmosphere, the resulting mixture was stirred at 120 degree centigrade for 3 hours. The reaction solution was returned to room temperature and poured into 500 mL of acetone for leaching the precipitate. The obtained solid was washed with acetone and water, and heat dissolved in chloroform. The insoluble portion was filtered off and then the filtrate was poured into methanol. The precipitate was leached and vacuum dried to obtain 2.85 g of a compound composed of repeating units of the formula (8) as a yellow solid.

Molecular Weight: 13,700

Glass Transition Temperature: 283 degree centigrade

UV (λmax): 381 (CHCl$_3$)

1.46 g of the polymer compound composed of repeating units of the formula (8) was introduced to 15 ml of 98% sulfuric acid under a nitrogen flow, and the resulting mixture was stirred at room temperature for 17 hours. The reaction solution was poured into 300 ml of pure water for leaching the precipitate. The obtained solid was washed with pure water until the pH of the filtrate became 5 and vacuum dried at 60 degree centigrade for 8 hours to obtain 1.63 g of a desired compound as a brown solid.

Incidentally, in accordance with the method as described in Example 1, the average number of sulfo groups per a repeating unit was calculated. Incidentally, the elementary analytical value of sulfur used in the calculation was 8.0%.

Average number of sulfo groups per repeating unit: 1.0

Example 3

(In the repeating unit represented by the formula (9), a sulfo group-containing polymer compound having at least one of repeating units in which at least one of benzene rings and naphthalene rings was substituted with a sulfo group in a polymer chain)

[Chemical Formula 19]

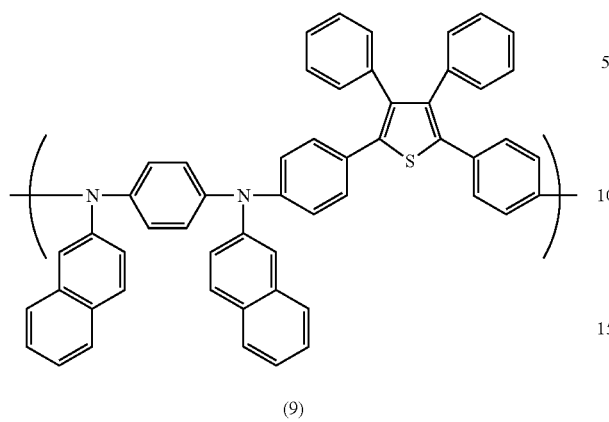

(9)

To a mixture of 3.75 g of N,N'-di(2-naphthyl)-1,4-phenylene diamine, 5.57 g of 2,5-bis(4'-bromophenyl)-3,4-diphenyl thiophene, 2.43 g of sodium tert-butoxide and 300 mL of o-xylene was added an o-xylene (1 mL) solution of 46 mg of tris(dibenzylideneacetone)dipalladium and 81 mg of tri-tert-butylphosphine under a nitrogen flow. In a nitrogen atmosphere, the resulting mixture was heat stirred at 120 degree centigrade for 3 hours. Then, the reaction solution was returned to room temperature and poured into 1,000 mL of acetone for leaching the precipitate. The obtained solid was washed with acetone and water, and dissolved in toluene. The solution was poured into acetone, and the precipitate was leached and vacuum dried to obtain 7.52 g of a compound composed of repeating units of the formula (9) as a yellowish green solid.

Molecular Weight: 10,100
Glass Transition Temperature: 256 degree centigrade
UV (λmax): 387 (tetrachloroethane)

0.73 g of the polymer compound composed of repeating units of the formula (9) was introduced to 14 g of 98% sulfuric acid under a nitrogen flow, and the resulting mixture was stirred at room temperature for 50 hours. The reaction solution was poured into 300 ml of acetonitrile for leaching the precipitate. The obtained solid was washed with acetonitrile until the pH of the filtrate became 7 and vacuum dried at 60 degree centigrade for 8 hours to obtain 0.87 g of a crude product as a brown solid. 0.87 g of the crude product was dissolved in 100 ml of 50% methanol water, and passed through 50 ml of an anion exchange resin (Dowex 1×8) treated with 1 mol/L sodium hydroxide water in advance. The distillate was concentrated to dryness and then vacuum dried at 70 degree centigrade for 7 hours to obtain 0.85 g of a desired compound as a brown solid. Incidentally, the compound was dissolved in methanol, but not dissolved in toluene.

Incidentally, in accordance with the method as described in Example 1, the average number of sulfo groups per a repeating unit was calculated. In addition, the elementary analytical value of sulfur used in the calculation was 13.6%.

Average number of sulfo groups per repeating unit: 3.3
UV (λmax): 341 (MeOH)

Example 4

(In the repeating unit represented by the formula (10), a sulfo group-containing polymer compound having at least one of repeating units in which at least one of benzene rings was substituted with a sulfo group in a polymer chain)

[Chemical Formula 20]

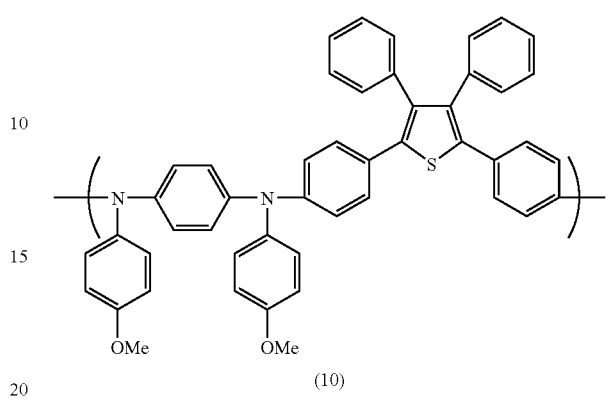

(10)

To a mixture of 1.00 g of N,N'-di(4-methoxyphenyl)-1,4-phenylene diamine, 1.71 g of 2,5-bis(4'-bromophenyl)-3,4-diphenyl thiophene, 0.95 g of sodium tert-butoxide and 80 mL of o-xylene was added an o-xylene (10 mL) solution of 14 mg of tris(dibenzylideneacetone)dipalladium and 13 mg of tri-tert-butylphosphine under a nitrogen flow. In a nitrogen atmosphere, the resulting mixture was heat stirred at 130 degree centigrade for 21 hours and then the insoluble portion was removed by hot filtering. The filtrate was concentrated and then poured into 100 mL of acetone for leaching the precipitate. The obtained solid was washed with acetone and water, and dissolved in toluene. The solution was poured into acetone, and the precipitate was leached and vacuum dried to obtain 1.68 g of a compound composed of repeating units of the formula (10) as a yellow solid.

Molecular Weight: 11,600

1.00 g of the polymer compound composed of repeating units of the formula (10) was introduced to 10 g of 98% sulfuric acid under a nitrogen flow, and the resulting mixture was stirred at room temperature for 49 hours. The reaction solution was poured into 150 ml of water for leaching the precipitate. The obtained solid was washed with water until the pH of the filtrate became 5 and vacuum dried at 70 degree centigrade for 12 hours to obtain 1.03 g of a crude product as a brown solid. 1.03 g of the crude product was dissolved in 100 ml of 50% methanol water, and passed through 50 ml of an anion exchange resin (Dowex 1×8) treated with 1 mol/L sodium hydroxide water in advance. The distillate was concentrated to dryness and then vacuum dried at 60 degree centigrade for 7 hours to obtain 0.96 g of a desired compound as a brown solid. Incidentally, the compound was dissolved in methanol, but not dissolved in toluene.

Incidentally, in accordance with the method as described in Example 1, the average number of sulfo groups per a repeating unit was calculated. Incidentally, the elementary analytical value of sulfur used in the calculation was 11.5%.

Average number of sulfo groups per repeating unit: 2.1

Example 5

(In the repeating unit represented by the formula (11), a sulfo group-containing polymer compound having at least one of repeating units in which at least one of benzene rings was substituted with a sulfo group in a polymer chain)

[Chemical Formula 21]

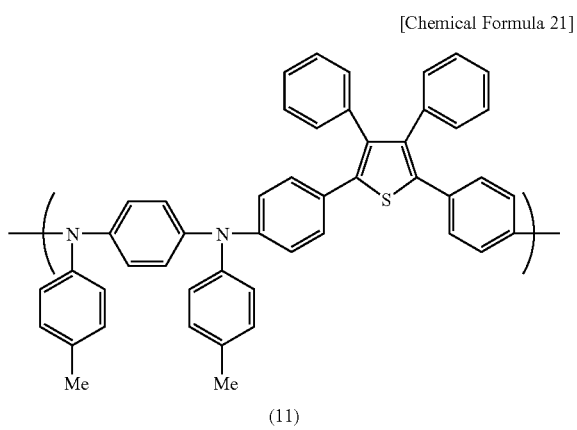

(11)

[Chemical Formula 22]

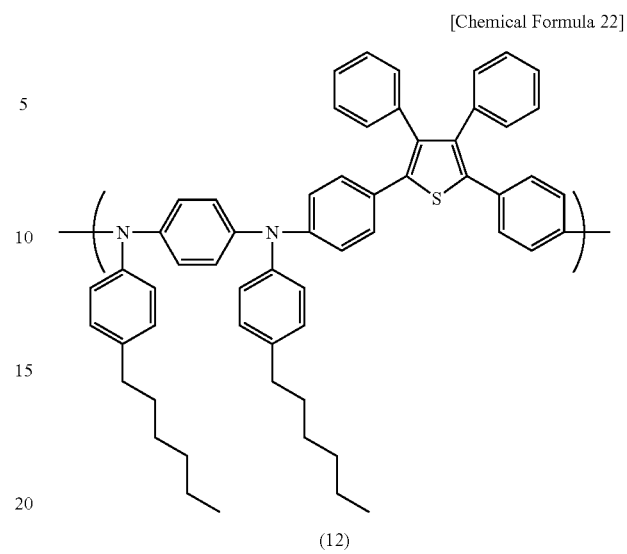

(12)

To a mixture of 1.00 g of N,N'-di(4-methylphenyl)-1,4-phenylene diamine, 1.89 g of 2,5-bis(4'-bromophenyl)-3,4-diphenyl thiophene, 1.05 g of sodium tert-butoxide and 90 mL of o-xylene was added an o-xylene (10 mL) solution of 16 mg of tris(dibenzylideneacetone)dipalladium and 15 mg of tri-tert-butylphosphine under a nitrogen flow. In a nitrogen atmosphere, the resulting mixture was heat stirred at 150 degree centigrade for 17 hours and then the insoluble portion was removed by hot filtering. The filtrate was concentrated and then poured into 100 mL of acetone for leaching the precipitate. The obtained solid was washed with acetone and water, and dissolved in toluene. The solution was poured into acetone, and the precipitate was leached and vacuum dried to obtain 1.96 g of a compound composed of repeating units of the formula (11) as a yellow solid.

Molecular Weight: 8,900

1.13 g of the polymer compound composed of repeating units of the formula (11) was introduced to 20 g of 98% sulfuric acid under a nitrogen flow, and the resulting mixture was stirred at room temperature for 40 hours. The reaction solution was poured into 200 ml of water for leaching the precipitate. The obtained solid was washed with water until the pH of the filtrate became 5 and vacuum dried at 60 degree centigrade for 2 hours to obtain 1.24 g of a crude product as a brown solid. 1.24 g of the crude product was dissolved in 100 ml of 50% methanol water, and passed through 50 ml of an anion exchange resin (Dowex 1×8) treated with 1 mol/L sodium hydroxide water in advance. The distillate was evaporated to dryness and then vacuum dried at 70 degree centigrade for 8 hours to obtain 1.20 g of a desired compound as a brown solid. Incidentally, the compound was dissolved in methanol, but not dissolved in toluene.

Incidentally, in accordance with the method as described in Example 1, the average number of sulfo groups per a repeating unit was calculated. Incidentally, the elementary analytical value of sulfur used in the calculation was 10.7%.

Average number of sulfo groups per repeating unit: 1.7

Example 6

(In the repeating unit represented by the formula (12), a sulfo group-containing polymer compound having at least one of repeating units in which at least one of benzene rings was substituted with a sulfo group in a polymer chain)

To a mixture of 1.01 g of N,N'-di(4-hexylphenyl)-1,4-phenylene diamine, 1.28 g of 2,5-bis(4'-bromophenyl)-3,4-diphenyl thiophene, 0.67 g of sodium tert-butoxide and 90 mL of o-xylene was added an o-xylene (10 mL) solution of 11 mg of tris(dibenzylideneacetone)dipalladium and 10 mg of tri-tert-butylphosphine under a nitrogen flow. In a nitrogen atmosphere, the resulting mixture was heat stirred at 150 degree centigrade for 20 hours and then the insoluble portion was removed by hot filtering. The filtrate was concentrated and then poured into 60 mL of acetone for leaching the precipitate. The obtained solid was washed with acetone and water, and dissolved in toluene. The solution was poured into acetone, and the precipitate was leached and vacuum dried to obtain 1.52 g of a compound composed of repeating units of the formula (12) as a yellow solid.

Molecular Weight: 10,500

1.09 g of the polymer compound composed of repeating units of the formula (12) was introduced to 20 g of 98% sulfuric acid under a nitrogen flow, and the resulting mixture was stirred at room temperature for 48 hours. The reaction solution was poured into 200 ml of water for leaching the precipitate. The obtained solid was washed with water until the pH of the filtrate became 5 and vacuum dried at 70 degree centigrade for 8 hours to obtain 1.14 g of a crude product as a brown solid. 1.14 g of the crude product was dissolved in 100 ml of 50% methanol water, and passed through 50 ml of an anion exchange resin (Dowex 1×8) treated with 1 mol/L sodium hydroxide water in advance. The distillate was concentrated to dryness and then vacuum dried at 70 degree centigrade for 10 hours to obtain 1.08 g of a desired compound as a brown solid. Incidentally, the compound was dissolved in methanol, but not dissolved in toluene.

Incidentally, in accordance with the method as described in Example 1, the average number of sulfo groups per a repeating unit was calculated. Incidentally, the elementary analytical value of sulfur used in the calculation was 9.3%.

Average number of sulfo groups per repeating unit: 1.8

Example 7

(In the repeating unit represented by the formula (13), a sulfo group-containing polymer compound having at least one of repeating units in which at least one of benzene rings was substituted with a sulfo group in a polymer chain)

[Chemical Formula 23]

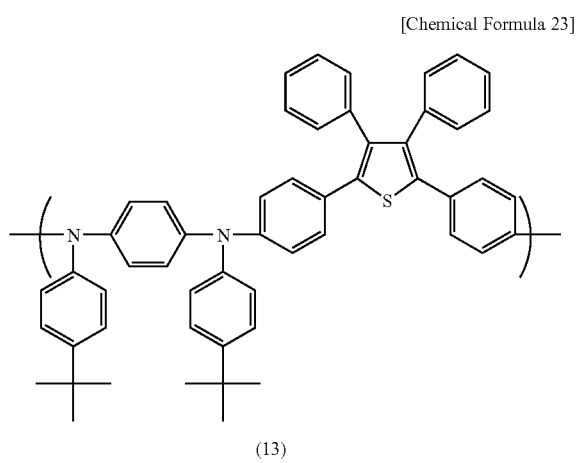

(13)

To a mixture of 0.48 g of N,N'-di(4-tert-butylphenyl)-1,4-phenylene diamine, 0.70 g of 2,5-bis(4'-bromophenyl)-3,4-diphenyl thiophene, 0.39 g of sodium tert-butoxide and 30 mL of o-xylene was added an o-xylene (9 mL) solution of 5.9 mg of tris(dibenzylideneacetone)dipalladium and 5.2 mg of tri-tert-butylphosphine under a nitrogen flow. In a nitrogen atmosphere, the resulting mixture was heat stirred at 130 degree centigrade for 21 hours and then the insoluble portion was removed by hot filtering. The filtrate was concentrated and then poured into 40 mL of acetone for leaching the precipitate. The obtained solid was washed with acetone and water, and dissolved in toluene. The solution was poured into acetone, and the precipitate was leached and vacuum dried to obtain 0.70 g of a compound composed of repeating units of the formula (13) as a yellow solid.

Molecular Weight: 4,300

0.65 g of the polymer compound composed of repeating units of the formula (13) was introduced to 28 g of 98% sulfuric acid under a nitrogen flow, and the resulting mixture was stirred at room temperature for 48 hours. The reaction solution was poured into 100 ml of water for leaching the precipitate. The obtained solid was washed with water until the pH of the filtrate became 5 and vacuum dried at 70 degree centigrade for 6 hours to obtain 0.72 g of a crude product as a brown solid. 0.72 g of the crude product was dissolved in 70 ml of 50% methanol water, and passed through 35 ml of an anion exchange resin (Dowex 1×8) treated with 1 mol/L sodium hydroxide water in advance. The distillate was evaporated to dryness and then vacuum dried at 70 degree centigrade for 7 hours to obtain 0.58 g of a desired compound as a brown solid. Incidentally, the compound was dissolved in methanol, but not dissolved in toluene.

Incidentally, in accordance with the method as described in Example 1, the average number of sulfo groups per a repeating unit was calculated. Incidentally, the elementary analytical value of sulfur used in the calculation was 10.5%.

Average number of sulfo groups per repeating unit: 2.0

Example 8

(In the repeating unit represented by the formula (14), a sulfo group-containing polymer compound having at least one of repeating units in which at least one of benzene rings was substituted with a sulfo group in a polymer chain)

[Chemical Formula 24]

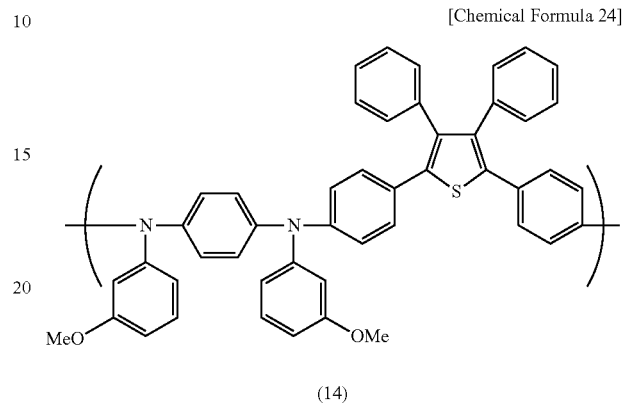

(14)

To a mixture of 0.58 g of N,N'-di(3-methoxyphenyl)-1,4-phenylene diamine, 1.00 g of 2,5-bis(4'-bromophenyl)-3,4-diphenyl thiophene, 0.53 g of sodium tert-butoxide and 60 mL of o-xylene was added an o-xylene (3 mL) solution of 11 mg of tris(dibenzylideneacetone)dipalladium and 10 mg of tri-tert-butylphosphine under a nitrogen flow. In a nitrogen atmosphere, the resulting mixture was heat stirred at 150 degree centigrade for 13 hours and then the insoluble portion was removed by hot filtering. The filtrate was concentrated and then poured into 60 mL of acetone for leaching the precipitate. The obtained solid was washed with acetone and water, and dissolved in toluene. The solution was poured into acetone, and the precipitate was leached and vacuum dried to obtain 0.26 g of a compound composed of repeating units of the formula (14) as a yellow solid.

Molecular Weight: 3,500

0.18 g of the polymer compound composed of repeating units of the formula (14) was introduced to 9 g of 98% sulfuric acid under a nitrogen flow, and the resulting mixture was stirred at room temperature for 48 hours. The reaction solution was poured into 50 ml of acetonitrile for leaching the precipitate. The obtained solid was washed with acetonitrile until the pH of the filtrate became 5 and vacuum dried at 70 degree centigrade for 10 hours to obtain 0.25 g of a crude product as a brown solid. 0.25 g of the crude product was dissolved in 30 ml of 50% methanol water, and passed through 15 ml of an anion exchange resin (Dowex 1×8) treated with 1 mol/L sodium hydroxide water in advance. The distillate was concentrated to dryness and then vacuum dried at 70 degree centigrade for 6 hours to obtain 0.04 g of a desired compound as a brown solid. Incidentally, the compound was dissolved in methanol, but not dissolved in toluene.

Incidentally, in accordance with the method as described in Example 1, the average number of sulfo groups per a repeating unit was calculated. Incidentally, the elementary analytical value of sulfur used in the calculation was 10.0%.

Average number of sulfo groups per repeating unit: 1.6

Example 9

(In the repeating unit represented by the formula (15) a sulfo group-containing polymer compound having at least one of repeating units in which at least one of benzene rings was substituted with a sulfo group in a polymer chain)

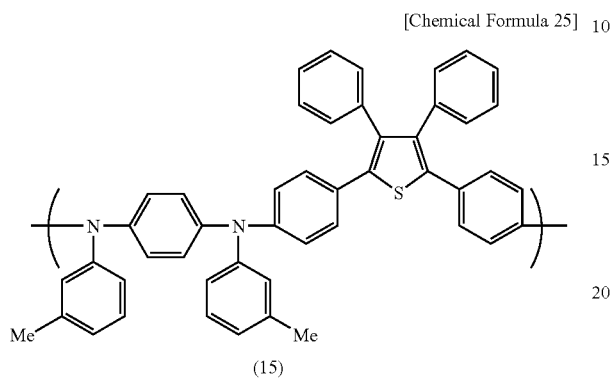

(15)

To a mixture of 0.52 g of N,N'-di(3-methoxyphenyl)-1,4-phenylene diamine, 0.98 g of 2,5-bis(4'-bromophenyl)-3,4-diphenyl thiophene, 0.53 g of sodium tert-butoxide and 50 mL of o-xylene was added an o-xylene (3 mL) solution of 9 mg of tris(dibenzylideneacetone)dipalladium and 8 mg of tri-tert-butylphosphine under a nitrogen flow. In a nitrogen atmosphere, the resulting mixture was heat stirred at 150 degree centigrade for 22 hours and then the insoluble portion was removed by hot filtering. The filtrate was concentrated and then poured into 60 mL of acetone for leaching the precipitate. The obtained solid was washed with acetone and water, and dissolved in toluene. The solution was poured into acetone, and the precipitate was leached and vacuum dried to obtain 0.34 g of a compound composed of repeating units of the formula (15) as a yellow solid.

Molecular Weight: 4,300

0.29 g of the polymer compound composed of repeating units of the formula (15) was introduced to 13 g of 98% sulfuric acid under a nitrogen flow, and the resulting mixture was stirred at room temperature for 48 hours. The reaction solution was poured into 50 ml of water for leaching the precipitate. The obtained solid was washed with water until the pH of the filtrate became 5 and vacuum dried at 70 degree centigrade for 8 hours to obtain 0.22 g of a crude product as a brown solid. 0.22 g of the crude product was dissolved in 20 ml of 50% methanol water, and passed through 10 ml of an anion exchange resin (Dowex 1×8) treated with 1 mol/L sodium hydroxide water in advance. The distillate was concentrated to dryness and then vacuum dried at 70 degree centigrade for 8 hours to obtain 0.16 g of a desired compound as a brown solid. Incidentally, the compound was dissolved in methanol, but not dissolved in toluene.

Incidentally, in accordance with the method as described in Example 1, the average number of sulfo groups per a repeating unit was calculated. Incidentally, the elementary analytical value of sulfur used in the calculation was 10.1%.

Average number of sulfo groups per repeating unit: 1.5

Example 10

(In the repeating unit represented by the formula (16), a sulfo group-containing polymer compound having at least one of repeating units in which at least one of benzene rings was substituted with a sulfo group in a polymer chain)

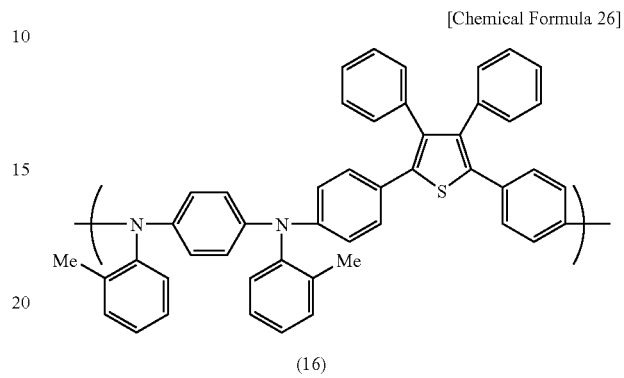

(16)

To a mixture of 1.06 g of N,N'-di(2-methylphenyl)-1,4-phenylene diamine, 2.02 g of 2,5-bis(4'-bromophenyl)-3,4-diphenyl thiophene, 1.05 g of sodium tert-butoxide and 100 mL of o-xylene was added an o-xylene (2 mL) solution of 20 mg of tris(dibenzylideneacetone)dipalladium and 18 mg of tri-tert-butylphosphine under a nitrogen flow. In a nitrogen atmosphere, the resulting mixture was heat stirred at 150 degree centigrade for 112 hours and then the insoluble portion was removed by hot filtering. The filtrate was concentrated and then poured into 100 mL of acetone for leaching the precipitate. The obtained solid was washed with acetone and water, and dissolved in toluene. The solution was poured into acetone, and the precipitate was leached and vacuum dried to obtain 2.03 g of a compound composed of repeating units of the formula (16) as a yellow solid.

Molecular Weight: 3,900

1.00 g of the polymer compound composed of repeating units of the formula (16) was introduced to 10 g of 95% sulfuric acid under a nitrogen flow, and the resulting mixture was stirred at room temperature for 67 hours. The reaction solution was poured into 100 ml of water for leaching the precipitate. The obtained solid was washed with water until the pH of the filtrate became 5 and vacuum dried at 70 degree centigrade for 10 hours to obtain 0.94 g of a crude product as a black solid. Incidentally, the compound was dissolved in methanol, but not dissolved in toluene.

Incidentally, in accordance with the method as described in Example 1, the average number of sulfo groups per a repeating unit was calculated. Incidentally, the elementary analytical value of sulfur used in the calculation was 10.9%.

Average number of sulfo groups per repeating unit: 1.8

Example 11

(In the repeating unit represented by the formula (17), a sulfo group-containing polymer compound having at least one of repeating units in which at least one of benzene rings and fluorene rings was substituted with a sulfo group in a polymer chain)

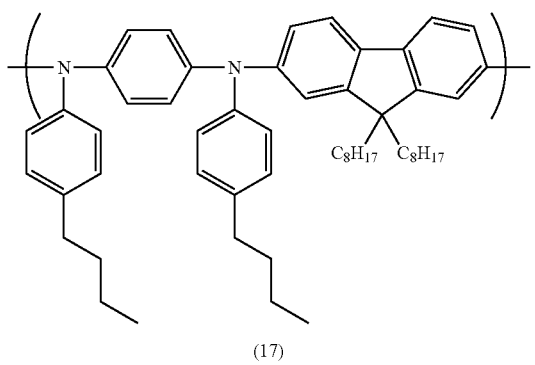

(17)

0.400 g of the polymer compound composed of repeating units of the formula (17) which can be commercially available (a product of ADS, Molecular weight: 11,000: ADS251BE) was introduced to 8 g of 98% sulfuric acid under a nitrogen flow, and the resulting mixture was stirred at room temperature for 48 hours. The reaction solution was poured into 40 ml of water for leaching the precipitate. The obtained solid was washed with pure water until the pH of the filtrate became 5 and vacuum dried at 70 degree centigrade for 12 hours to obtain 0.36 g of a desired compound as a brown solid.

Incidentally, in accordance with the method as described in Example 1, the average number of sulfo groups per a repeating unit was calculated. Incidentally, the elementary analytical value of sulfur used in the calculation was 1.3%.

Average number of sulfo groups per repeating unit: 0.5

Example 12

(In the repeating unit represented by the formula (18), a sulfo group-containing polymer compound having at least one of repeating units in which at least one of benzene rings and fluorene rings was substituted with a sulfo group in a polymer chain)

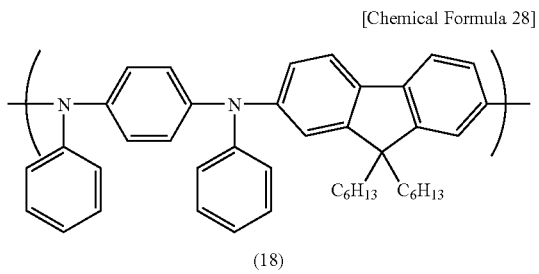

(18)

To a mixture of 0.87 g of N,N'-diphenyl-1,4-phenylene diamine, 1.65 g of 9,9'-dihexyl-2,7-dibromofluorene, 0.81 g of sodium tert-butoxide and 50 mL of o-xylene was added an o-xylene (1 mL) solution of 15 mg of tris(dibenzylideneacetone)dipalladium and 27 mg of tri-tert-butylphosphine under a nitrogen flow. In a nitrogen atmosphere, the resulting mixture was heat stirred at 130 degree centigrade for 20 hours and then the insoluble portion was removed by hot filtering. The filtrate was concentrated and then poured into 100 mL of acetone for leaching the precipitate. The obtained solid was washed with acetone and water, and dissolved in toluene. The solution was poured into acetone, and the precipitate was leached and vacuum dried to obtain 1.80 g of a compound composed of repeating units of the formula (18) as a brown solid.

Molecular Weight: 5,800

0.50 g of the polymer compound composed of repeating units of the formula (18) was introduced to 28 g of 95% sulfuric acid under a nitrogen flow, and the resulting mixture was stirred at room temperature for 43 hours. The reaction solution was poured into 100 ml of water for leaching the precipitate. The obtained solid was washed with water until the pH of the filtrate became 5 and vacuum dried at 70 degree centigrade for 8 hours to obtain 0.45 g of a crude product as a black solid.

Incidentally, in accordance with the method as described in Example 1, the average number of sulfo groups per a repeating unit was calculated. Incidentally, the elementary analytical value of sulfur used in the calculation was 2.6%.

Average number of sulfo groups per repeating unit: 0.74

Example 13

(In the repeating unit represented by the formula (19) a sulfo group-containing polymer compound having at least one of repeating units in which at least one of benzene rings was substituted with a sulfo group in a polymer chain)

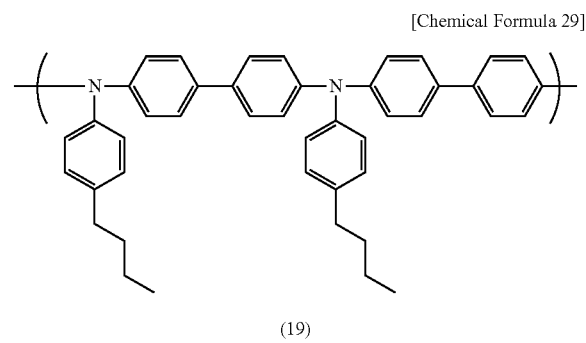

(19)

0.400 g of the polymer compound composed of repeating units of the formula (19) which can be commercially available (a product of ADS, Molecular weight: 28,000: ADS254BE) was introduced to 8 g of 98% sulfuric acid under a nitrogen flow, and the resulting mixture was stirred at room temperature for 48 hours. The reaction solution was poured into 40 ml of water for leaching the precipitate. The obtained solid was washed with pure water until the pH of the filtrate became 5 and vacuum dried at 70 degree centigrade for 12 hours to obtain 0.38 g of a desired compound as a brown solid.

Incidentally, in accordance with the method as described in Example 1, the average number of sulfo groups per a repeating unit was calculated. Incidentally, the elementary analytical value of sulfur used in the calculation was 1.0%.

Average number of sulfo groups per repeating unit: 0.2

Example 14

(In the repeating unit represented by the formula (20), a sulfo group-containing polymer compound having at least one of repeating units in which at least one of benzene rings was substituted with a sulfo group in a polymer chain)

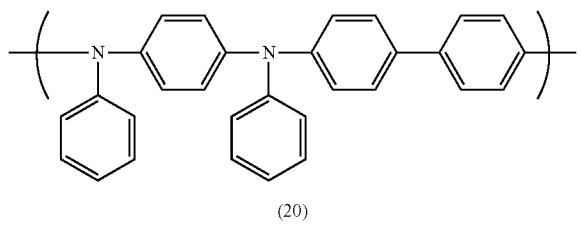

(20)

To a mixture of 0.87 g of N,N'-diphenyl-1,4-phenylene diamine, 1.38 g of 4,4'-dibromobipheny, 0.92 g of sodium tert-butoxide and 50 mL of o-xylene was added an o-xylene (1 mL) solution of 15 mg of tris(dibenzylideneacetone)dipalladium and 27 mg of tri-tert-butylphosphine under a nitrogen flow. In a nitrogen atmosphere, the resulting mixture was heat stirred at 130 degree centigrade for 20 hours and then the insoluble portion was removed by hot filtering. The filtrate was concentrated and then poured into 100 mL of acetone for leaching the precipitate. The obtained solid was washed with acetone and water, and dissolved in toluene. The solution was poured into acetone, and the precipitate was leached and vacuum dried to obtain 0.73 g of a compound composed of repeating units of the formula (20) as a yellowish brown solid.

Molecular Weight: 4,100

0.50 g of the polymer compound composed of repeating units of the formula (20) was introduced to 28 g of 95% sulfuric acid under a nitrogen flow, and the resulting mixture was stirred at room temperature for 43 hours. The reaction solution was poured into 100 ml of water for leaching the precipitate. The obtained solid was washed with water until the pH of the filtrate became 5 and vacuum dried at 70 degree centigrade for 8 hours to obtain 0.44 g of a crude product as a black solid.

Incidentally, in accordance with the method as described in Example 1, the average number of sulfo groups per a repeating unit was calculated. Incidentally, the elementary analytical value of sulfur used in the calculation was 1.5%.

Average number of sulfo groups per repeating unit: 0.20

Example 15

(In the repeating unit represented by the formula (21), a sulfo group-containing polymer compound having at least one of repeating units in which at least one of benzene rings was substituted with a sulfo group in a polymer chain)

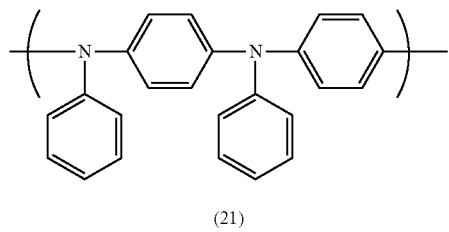

(21)

To a mixture of 1.09 g of N,N'-diphenyl-1,4-phenylene diamine, 1.00 g of 1,4-dibromobenzene, 1.24 g of sodium tert-butoxide and 30 mL of o-xylene was added an o-xylene (2 mL) solution of 20 mg of tris(dibenzylideneacetone)dipalladium and 35 mg of tri-tert-butylphosphine under a nitrogen flow. In a nitrogen atmosphere, the resulting mixture was heat stirred at 135 degree centigrade for 3 hours and then the insoluble portion was removed by hot filtering. The filtrate was concentrated and then poured into 60 mL of acetone for leaching the precipitate. The obtained solid was washed with acetone and water, and dissolved in toluene. The solution was poured into acetone, and the precipitate was leached and vacuum dried to obtain 1.24 g of a compound composed of repeating units of the formula (21) as a light gray solid.

Molecular Weight: 1,000

0.60 g of the polymer compound composed of repeating units of the formula (21) was introduced to 6 g of 95% sulfuric acid under a nitrogen flow, and the resulting mixture was stirred at room temperature for 23 hours. The reaction solution was poured into 60 ml of water for leaching the precipitate. The obtained solid was washed with water until the pH of the filtrate became 5 and vacuum dried at 70 degree centigrade for 10 hours to obtain 0.65 g of a product as a green solid.

Incidentally, in accordance with the method as described in Example 1, the average number of sulfo groups per a repeating unit was calculated. Incidentally, the elementary analytical value of sulfur used in the calculation was 12.0%.

Average number of sulfo groups per repeating unit: 1.8

Example 16

(In the repeating unit represented by the formula (22), a sulfo group-containing polymer compound having at least one of repeating units in which at least one of benzene rings and naphthalene rings was substituted with a sulfo group in a polymer chain)

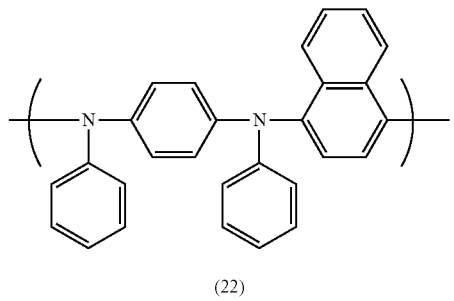

(22)

To a mixture of 0.87 g of N,N'-diphenyl-1,4-phenylene diamine, 1.04 g of 1,4-dibromonaphthalene, 0.85 g of sodium tert-butoxide and 50 mL of o-xylene was added an o-xylene (1 mL) solution of 15 mg of tris(dibenzylideneacetone)dipalladium and 27 mg of tri-tert-butylphosphine under a nitrogen flow. In a nitrogen atmosphere, the resulting mixture was heat stirred at 130 degree centigrade for 3 hours and then the insoluble portion was removed by hot filtering. The filtrate was concentrated and then poured into 60 mL of acetone for leaching the precipitate. The obtained solid was washed with acetone and water, and dissolved in toluene. The solution was poured into acetone, and the precipitate was leached and vacuum dried to obtain 0.95 g of a compound composed of repeating units of the formula (22) as a yellow solid.

Molecular Weight: 4,900

0.33 g of the polymer compound composed of repeating units of the formula (22) was introduced to 28 g of 98% sulfuric acid under a nitrogen flow, and the resulting mixture was stirred at room temperature for 43 hours. The reaction solution was poured into 50 ml of water for leaching the precipitate. The obtained solid was washed with water until the pH of the filtrate became 5 and vacuum dried at 70 degree centigrade for 8 hours to obtain 0.26 g of a desired product as a brown solid.

Incidentally, in accordance with the method as described in Example 1, the average number of sulfo groups per a repeating unit was calculated. Incidentally, the elementary analytical value of sulfur used in the calculation was 1.9%.

Average number of sulfo groups per repeating unit: 0.24

Example 17

(In the repeating unit represented by the formula (23), a sulfo group-containing polymer compound having at least one of repeating units in which at least one of benzene rings and anthracene rings was substituted with a sulfo group in a polymer chain)

[Chemical Formula 33]

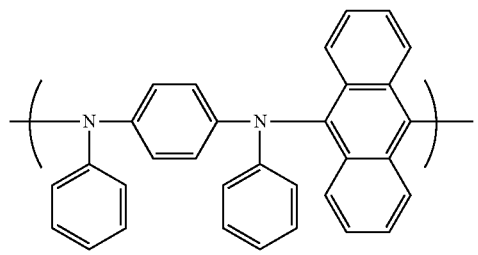

(23)

To a mixture of 0.76 g of N,N'-diphenyl-1,4-phenylene diamine, 1.00 g of 9,10-dibromoanthracene, 0.86 g of sodium tert-butoxide and 30 mL of o-xylene was added an o-xylene (2 mL) solution of 15 mg of tris(dibenzylideneacetone)dipalladium and 24 mg of tri-tert-butylphosphine under a nitrogen flow. In a nitrogen atmosphere, the resulting mixture was heat stirred at 135 degree centigrade for 3 hours and then the insoluble portion was removed by hot filtering. The filtrate was concentrated and then poured into 60 mL of acetone for leaching the precipitate. The obtained solid was washed with acetone and water, and dissolved in toluene. The solution was poured into acetone, and the precipitate was leached and vacuum dried to obtain 0.95 g of a compound composed of repeating units of the formula (23) as a red solid.

Molecular Weight: 1,400

0.50 g of the polymer compound composed of repeating units of the formula (23) was introduced to 5 g of 95% sulfuric acid under a nitrogen flow, and the resulting mixture was stirred at room temperature for 67 hours. The reaction solution was poured into 50 ml of water for leaching the precipitate. The obtained solid was washed with water until the pH of the filtrate became 5 and vacuum dried at 70 degree centigrade for 10 hours to obtain 0.41 g of a product as a brown solid.

Incidentally, in accordance with the method as described in Example 1, the average number of sulfo groups per a repeating unit was calculated. Incidentally, the elementary analytical value of sulfur used in the calculation was 10.8%.

Average number of sulfo groups per repeating unit: 2.0

Example 18

(In the repeating unit represented by the formula (24), a sulfo group-containing polymer compound having at least one of repeating units in which at least one of benzene rings and carbazole rings was substituted with a sulfo group in a polymer chain)

[Chemical Formula 34]

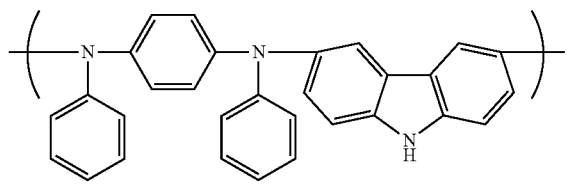

(24)

To a mixture of 0.78 g of N,N'-diphenyl-1,4-phenylene diamine, 1.0 g of 3,6-dibromocarbazole, 0.73 g of sodium tert-butoxide and 30 mL of o-xylene was added an o-xylene (2 mL) solution of 14 mg of tris(dibenzylideneacetone)dipalladium and 27 mg of tri-tert-butylphosphine under a nitrogen flow. In a nitrogen atmosphere, the resulting mixture was heat stirred at 135 degree centigrade for 3 hours and then the insoluble portion was removed by hot filtering. The filtrate was concentrated and then poured into 60 mL of acetone for leaching the precipitate. The obtained solid was washed with acetone and water, and dissolved in toluene. The solution was poured into acetone, and the precipitate was leached and vacuum dried to obtain 0.81 g of a compound composed of repeating units of the formula (24) as a yellow solid.

Molecular Weight: 2,500

0.4 g of the polymer compound composed of repeating units of the formula (24) was introduced to 4 g of 98% sulfuric acid under a nitrogen flow, and the resulting mixture was stirred at room temperature for 24 hours. The reaction solution was poured into 40 ml of water for leaching the precipitate. The obtained solid was washed with water until the pH of the filtrate became 5 and vacuum dried at 70 degree centigrade for 8 hours to obtain 0.38 g of a desired product as a brown solid.

Incidentally, in accordance with the method as described in Example 1, the average number of sulfo groups per a repeating unit was calculated. Incidentally, the elementary analytical value of sulfur used in the calculation was 4.7%.

Average number of sulfo groups per repeating unit: 0.7

Example 19

(In the repeating unit represented by the formula (25), a sulfo group-containing polymer compound having at least one of repeating units in which at least one of benzene rings and dibenzothiophene rings was substituted with a sulfo group in a polymer chain)

[Chemical Formula 35]

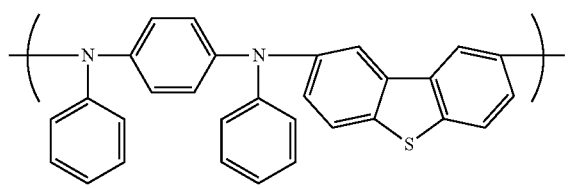

(25)

To a mixture of 0.73 g of N,N'-diphenyl-1,4-phenylene diamine, 1.00 g of 2,8-dibromodibenzothiophene, 0.83 g of sodium tert-butoxide and 30 mL of o-xylene was added an o-xylene (2 mL) solution of 15 mg of tris(dibenzylideneacetone)dipalladium and 27 mg of tri-tert-butylphosphine under a nitrogen flow. In a nitrogen atmosphere, the resulting mixture was heat stirred at 135 degree centigrade for 3 hours and then the insoluble portion was removed by hot filtering. The filtrate was concentrated and then poured into 60 mL of acetone for leaching the precipitate. The obtained solid was washed with acetone and water, and dissolved in toluene. The solution was poured into acetone, and the precipitate was leached and vacuum dried to obtain 0.78 g of a compound composed of repeating units of the formula (25) as a flesh-colored solid.

Molecular Weight: 2,700

0.35 g of the polymer compound composed of repeating units of the formula (25) was introduced to 3.5 g of 95% sulfuric acid under a nitrogen flow, and the resulting mixture was stirred at room temperature for 23 hours. The reaction solution was poured into 35 ml of water for leaching the precipitate. The obtained solid was washed with water until the pH of the filtrate became 5 and vacuum dried at 70 degree centigrade for 10 hours to obtain 0.32 g of a product as a light green solid.

Incidentally, in accordance with the method as described in Example 1, the average number of sulfo groups per a repeating unit was calculated. Incidentally, the elementary analytical value of sulfur used in the calculation was 5.1%.

Average number of sulfo groups per repeating unit: 0.8

Example 20

Production of Organic Electroluminescent Element

A glass substrate with an ITO transparent electrode (anode) having a thickness of 200 nm was ultrasonically cleaned using a neutral detergent, Semico Clean (a product of Furuuchi Chemical Corporation), ultra pure water, acetone and ethanol. This substrate was dried using a nitrogen gas, and further subjected to UV/ozone cleaning. First, a film having a thickness of 20 nm was formed on the ITO transparent electrode using a methanol solution of the sulfo group-containing polymer compound obtained in Example 1 (a solution obtained by dissolving 20 mg of the polymer compound in 4 mL of methanol) as a hole injection material according to the spin coating method, and vacuum dried on a hot plate (100 degree centigrade for 30 minutes) to form a layer. Next, the glass substrate was fixed on a substrate holder of a deposition device, and a deposition bath was set at reduced pressure of $3\times10^{-4}$ Pa. N,N'-di(1-naphthyl)-N,N'-diphenyl benzidine was deposited over the ITO transparent electrode to a thickness of 40 nm at a deposition rate of 0.2 nm/sec and then tris(8-quinolinolato)aluminum was deposited over the ITO transparent electrode to a thickness of 50 nm at a deposition rate of 0.2 nm/sec. Further, lithium fluoride was deposited over the ITO transparent electrode to a thickness of 0.5 nm at a decomposition rate of 0.2 nm/sec. Aluminum was deposited thereon to form a cathode and an organic electroluminescent element (organic EL element-1) was produced.

Incidentally, the deposition was conducted at a state that the deposition bath was maintained at reduced pressure. A direct current voltage was applied to the produced organic electroluminescent element, and the organic electroluminescent element was continuously driven at 50 degree centigrade in a dry atmosphere at a constant current density of 10 mA/cm². Luminescence of a green color with 4.03 V and a brightness of 285 cd/m² was identified at the initial stage. The element was allowed to stand at 100 degree centigrade for 1 hour and it was confirmed that there was no big change in luminescent properties.

The times taken until the attenuation of the luminescent brightness reached 20% and 50% of the initial brightness were measured and the results were shown in Table 1.

Reference Example

Evaluation of Film-Forming Property

A film having a thickness of 50 nm was formed on the glass substrate using a methanol solution of the polymer compound obtained in Example 1 (a solution obtained by dissolving 20 mg of the polymer compound in 4 mL of methanol) according to the spin coating method, and vacuum dried on a hot plate (100 degree centigrade for 30 minutes). The obtained film was observed, and as a result, a uniform film was formed.

Comparative Example 1

Evaluation of Film-Forming Property

A film was formed in the same manner as in Reference Example using PEDOT/PSS (Bayer AG, product name: BaytronP) instead of the polymer compound obtained in Example 1. The film was observed and as a result, variations on the film thickness were confirmed as compared to the film formed by using the polymer compound obtained in Example 1.

[Chemical Formula 36]

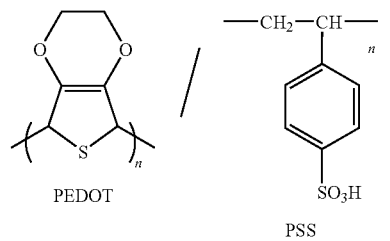

Comparative Example 2

Evaluation of Life of Organic Electroluminescent Element

In Example 20, an organic electroluminescent element (organic EL element-2) was produced in the same manner as in Example 20, except that the sulfo group-containing polymer compound obtained in Example 1 was used instead of PEDOT/PSS as a hole injection material. Luminescent life of the element was compared.

The times taken until the attenuation of the luminescent brightness reached 20% and 50% of the initial brightness were shown in Table 1 as relative values when that of the organic EL element-1 was 100.

TABLE 1

| | Element No. | Hole injection material | Luminescent life (20% attenuation) | (50% attenuation) |
|---|---|---|---|---|
| Example 20 | Organic EL element-1 | Compound as described in Example 1 | 100 | 100 |
| Comparative Example 2 | Organic EL element-2 | PEDOT/PSS | 1 | 8 |

As clear from Table 1, the organic electroluminescent element using the sulfo group-containing polymer compound of the present invention as a hole injection material showed a long luminescent life as compared to the comparative element.

INDUSTRIAL APPLICABILITY

An organic electroluminescent element obtained by using the sulfo group-containing polymer compound of the present invention can be used in panel-type light sources, various luminescent elements, display elements, marks and sensors.

The invention claimed is:

1. A sulfo group-containing polymer compound having a structure formed by introducing sulfo groups into a polymer compound comprising repeating units represented by the general formula (1),

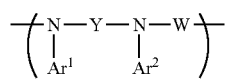

wherein, in the formula, $Ar^1$ and $Ar^2$ each represents a monovalent aromatic group; Y represents a divalent group comprising an aromatic group; W represents a divalent aromatic group having 4 to 30 carbon atoms; a group represented by Y is a group represented by the general formula (a), and a group represented by W is a group represented by general formula (b-8),

Y:

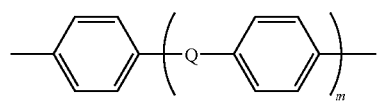

wherein, in the formula, -Q- is a group selected from the group consisting of a single bond, —O—, —S—, —CH$_2$—, —CMe$_2$-, —CO—, —SO—, —SO$_2$—, —SiH$_2$— and —SiMe$_2$-; and m represents an integer of 0 to 2,

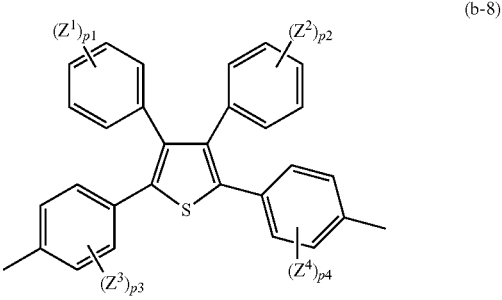

wherein, in the formula (b-8), $Z^1$ to $Z^4$ each represents a substituent; p1 and p2 each represents an integer of 0 to 5; p3 and p4 each represents an integer of 0 to 4, and wherein at least one of repeating units in which $Ar^1$, $Ar^2$, Y and at least one of four benzene rings bonded to a thiophene ring are substituted with a sulfo group in a polymer chain, in the repeating unit represented by the general formula (2),

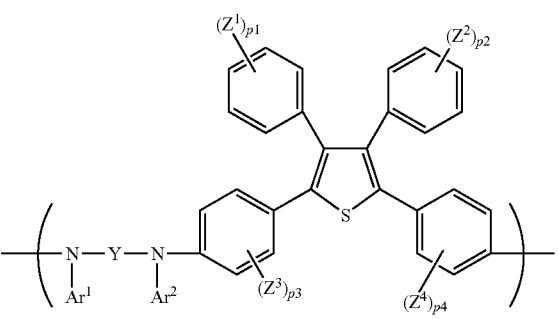

wherein, in the formula, $Ar^1$, $Ar^2$ and Y are the same as the general formula (1); $Z^1$ to $Z^4$ each represents a substituent; p1 and p2 each represents an integer of 0 to 5; p3 and h4 each represents an integer of 0 to 4.

2. The sulfo group-containing polymer compound as set forth in claim 1, having at least one of repeating units in which at least one of benzene rings is substituted with a sulfo group in a polymer chain, in the repeating unit represented by the general formula (3),

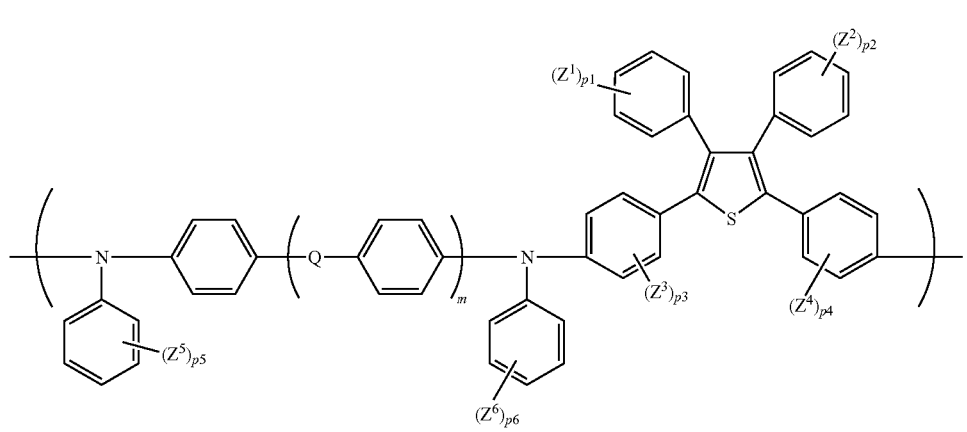

(3)

wherein, in the formula, $Z^1$ to $Z^4$ and p1 to p4 are the same as described above; $Z^5$ and $Z^6$ each represents a substituent; p5 and p6 each represents an integer of 0 to 5; m represents an integer of 0 to 2; and -Q- represents a group represented by a single bond, —O—, —S—, —CH$_2$—, —CMe$_2$-, —CO—, —SO—, —SO$_2$—, —SiH$_2$— or —SiMe$_2$-.

3. The sulfo group-containing polymer compound as set forth in claim 1, having at least one of repeating units in which at least one of benzene rings is substituted with a sulfo group in a polymer chain, in the repeating unit represented by the general formula (3a),

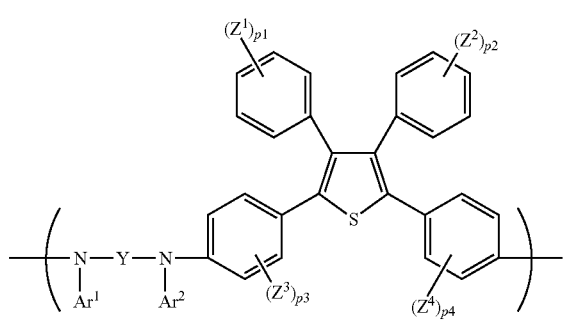

(2)

wherein, in the formula, $Ar^1$ and $Ar^2$ each represents a monovalent aromatic group; Y represents a divalent group comprising an aromatic group; $Z^1$ to $Z^4$ each represents a substituent; p1 and p2 each represents an integer of 0 to 5; p3 and p4 each represents an integer of 0 to 4.

5. The sulfo group-containing polymer compound as set forth in claim 1, wherein said $Z^1$ to $Z^4$ may be the same or different and are each a group selected from the group consisting of a carboxyl group, an alkoxycarbonyl group, a car-

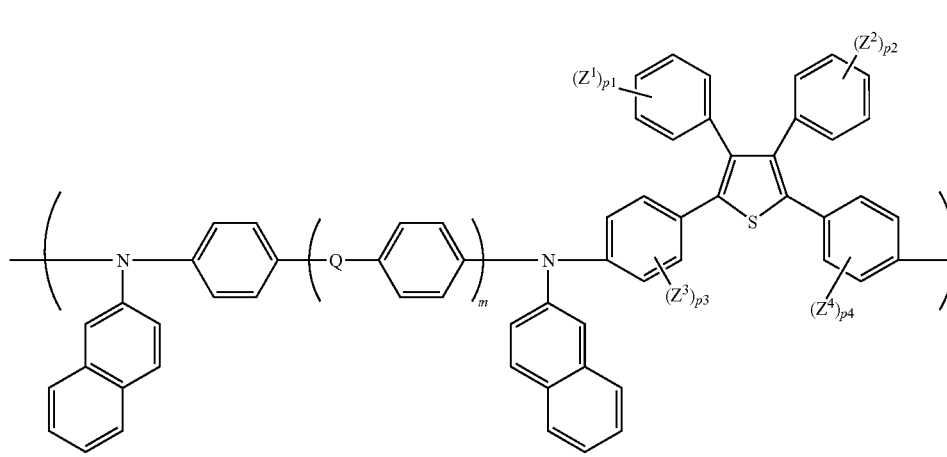

(3a)

wherein, in the formula, $Z^1$ to $Z^4$ and p1 to p4 are the same as described above; m represents an integer of 0 to 2; and -Q- represents a group represented by a single bond, —O—, —S—, —CH$_2$—, —CMe$_2$-, —CO—, —SO—, —SO$_2$—, —SiH$_2$— or —SiMe$_2$-.

4. A process for producing a sulfo group-containing polymer compound comprising sulfonating a polymer compound composed of repeating units represented by the general formula (2), bonyl group, a hydroxyl group, an amino group, a monosubstituted amino group, a disubstituted amino group and a group represented by the general formula (1a), $$-(O)_L\text{-}D \qquad (1a)$$

wherein, in the formula, D represents an unsubstituted or substituted linear, branched or cyclic alkyl group having 1 to 8 carbon atoms, an unsubstituted or substituted monovalent aromatic group having 4 to 12 carbon atoms, or an unsubstituted or substituted aralkyl group having 5 to 20 carbon atoms; and L represent 0 or 1.

6. The sulfo group-containing polymer compound as set forth in claim 2, wherein said $Z^1$ to $Z^4$ may be the same or different and are each a group selected from the group consisting of a carboxyl group, an alkoxycarbonyl group, a carbonyloxy group, a hydroxyl group, an amino group, a monosubstituted amino group, a di-substituted amino group and a group represented by the general formula (1a), $$-(O)_L\text{-}D \qquad (1a)$$

wherein, in the formula, D represents an unsubstituted or substituted linear, branched or cyclic alkyl group having 1 to 8 carbon atoms, an unsubstituted or substituted monovalent aromatic group having 4 to 12 carbon atoms, or an unsubstituted or substituted aralkyl group having 5 to 20 carbon atoms; and L represent 0 or 1.

7. The sulfo group-containing polymer compound as set forth in claim 3, wherein said $Z^1$ to $Z^4$ ma be the same or different and are each a group selected from the group consisting of a carboxyl group, an alkoxycarbonyl group, a carbonyloxy group, a hydroxyl group, an amino group, a monosubstituted amino group, a di-substituted amino group and a group represented by the general formula (1a), $$-(O)_L\text{-}D \qquad (1a)$$

wherein, in the formula, D represents an unsubstituted or substituted linear, branched or cyclic alkyl group having 1 to 8 carbon atoms, an unsubstituted or substituted monovalent aromatic group having 4 to 12 carbon atoms, or an unsubstituted or substituted aralkyl group having 5 to 20 cation atoms; and L represents 0 or 1.

8. An organic electroluminescent material comprising the sulfo group-containing polymer compound as set forth in claim 1.

9. An organic electroluminescent material comprising the sulfo group-containing polymer compound as set forth in claim 2.

10. An organic electroluminescent material comprising the sulfo group-containing polymer compound as set forth in claim 3.

11. An organic electroluminescent element obtained by interposing at least one layer containing at least one kind of the sulfo group-containing polymer compounds as set forth in claim 1 between a pair of electrodes.

12. An organic electroluminescent element obtained by interposing at least one layer containing at least one kind of the sulfo group-containing polymer compounds as set forth in claim 2 between a pair of electrodes.

13. An organic electroluminescent element obtained by interposing at least one layer containing at least one kind of the sulfo group-containing polymer compounds as set forth in claim 3 between a pair of electrodes.

14. The organic electroluminescent element as set forth in claim 11, wherein the at least one layer is an electric charge injection transport layer.

15. The organic electroluminescent element as set forth in claim 12, wherein the at least one layer is an electric charge injection transport layer.

16. The organic electroluminescent element as set forth in claim 13, wherein the at least one layer is an electric charge injection transport layer.

17. The organic electroluminescent element as set forth in claim 14, wherein the electric charge injection transport layer is a hole injection transport layer.

18. The organic electroluminescent element as set forth in claim 15, wherein the electric charge infection transport layer is a hole injection transport layer.

19. The organic electroluminescent element as set forth in claim 16, wherein the electric charge infection transport layer is a hole injection transport layer.

20. The organic electroluminescent element as set forth in claim 11, wherein the at least one layer is a luminescent layer.

21. The organic electroluminescent element as set forth in claim 12, wherein the at least one layer is a luminescent layer.

22. The organic electroluminescent element as set forth in claim 13, wherein the at least one layer is a luminescent layer.

23. The organic electroluminescent element as set forth in claim 17, wherein a luminescent layer is further provided between a pair of electrodes.

24. The organic electroluminescent element as set forth in claim 18, wherein a luminescent layer is further provided between a pair of electrodes.

25. The organic electroluminescent element as set forth in claim 19, wherein a luminescent layer is further provided between a pair of electrodes.

26. The organic electroluminescent element as set forth in claim 23, wherein an electron injection transport layer is further provided between a pair of electrodes.

27. The organic electroluminescent element as set forth in claim 24, wherein an electron infection transport layer is further provided between a pair of electrodes.

28. The organic electroluminescent element as set forth in claim 25, wherein an electron injection transport layer is further provided between a pair of electrodes.

* * * * *